(12) United States Patent
Blush et al.

(10) Patent No.: US 10,858,884 B2
(45) Date of Patent: Dec. 8, 2020

(54) ELECTRIC POTENTIALLY-DRIVEN SHADE WITH IMPROVED COIL STRENGTH, AND/OR METHOD OF MAKING THE SAME

(71) Applicant: Guardian Glass, LLC, Auburn Hills, MI (US)

(72) Inventors: Jason Blush, Milford, MI (US); Timothy J. Frey, Syracuse, IN (US); Yabei Gu, Auburn Hills, MI (US); Rudolph Hugo Petrmichl, Ann Arbor, MI (US)

(73) Assignee: Guardian Glass, LLC, Auburn Hills, MI (US)

( * ) Notice: Subject to any disclaimer, the term of this patent is extended or adjusted under 35 U.S.C. 154(b) by 210 days.

(21) Appl. No.: 16/028,593

(22) Filed: Jul. 6, 2018

(65) Prior Publication Data
US 2020/0011130 A1 Jan. 9, 2020

(51) Int. Cl.
*G02B 26/02* (2006.01)
*E06B 9/40* (2006.01)
(Continued)

(52) U.S. Cl.
CPC .......... *E06B 9/40* (2013.01); *B32B 17/10706* (2013.01); *C03C 17/3639* (2013.01);
(Continued)

(58) Field of Classification Search
CPC .. E06B 3/6722; E06B 9/42; E06B 2009/2417; E06B 2009/2464; E06B 2009/2643; E06B 9/24; B32B 7/12; B32B 17/06; B32B 27/06; G02F 1/19; G02F 2202/022; G02F 2203/02; G02B 26/0816
(Continued)

(56) References Cited

U.S. PATENT DOCUMENTS 3,236,290 A 2/1966 Lueder
3,897,997 A 8/1975 Kalt
(Continued)

FOREIGN PATENT DOCUMENTS

CN 106050071 A 10/2016
EP 1241507 5/2005
(Continued)

OTHER PUBLICATIONS

U.S. Appl. No. 16/028,502, filed Jul. 6, 2018, Vandal et al.
(Continued)

*Primary Examiner* — Euncha P Cherry

(57) ABSTRACT

Certain example embodiments relate to electric, potentially-driven shades usable with insulating glass (IG) units, IG units including such shades, and/or associated methods. In such a unit, a dynamic shade is located between the substrates defining the IG unit, and is movable between retracted and extended positions. The dynamic shade includes on-glass layers including a transparent conductor and an insulator or dielectric film, as well as a shutter. The shutter includes a resilient polymer, a conductor, and optional ink. The polymer may be capable of surviving high-temperature environments and may be colored in some instances. Material selection and/or processing helps improve coil strength.

24 Claims, 11 Drawing Sheets

(51) Int. Cl.
*B32B 17/10* (2006.01)
*C03C 17/36* (2006.01)
*H01L 31/0224* (2006.01)
*E06B 9/24* (2006.01)

(52) U.S. Cl.
CPC ...... *C03C 17/3649* (2013.01); *C03C 17/3678* (2013.01); *G02B 26/02* (2013.01); *H01L 31/022425* (2013.01); *E06B 2009/2464* (2013.01); *E06B 2009/2476* (2013.01)

(58) Field of Classification Search
USPC .......................................................... 359/230
See application file for complete search history.

(56) References Cited

U.S. PATENT DOCUMENTS

| | | |
|---|---|---|
| 3,989,357 A | 11/1976 | Kalt |
| 4,094,590 A | 6/1978 | Kalt |
| 4,105,294 A | 8/1978 | Peck |
| 4,208,103 A | 6/1980 | Kalt et al. |
| 4,248,501 A | 2/1981 | Simpson |
| 4,266,339 A | 5/1981 | Kalt |
| 4,336,536 A | 6/1982 | Kalt et al. |
| 4,383,255 A | 5/1983 | Grandjean et al. |
| 4,468,663 A | 8/1984 | Kalt |
| 4,488,784 A | 12/1984 | Kalt et al. |
| 4,695,837 A | 9/1987 | Kalt |
| 4,747,670 A | 5/1988 | Devio et al. |
| 4,788,089 A | 11/1988 | Skipper |
| 4,915,486 A | 4/1990 | Hansen |
| 4,978,952 A | 12/1990 | Irwin |
| 5,231,559 A | 7/1993 | Kalt et al. |
| 5,519,565 A | 5/1996 | Kalt et al. |
| 5,554,434 A | 9/1996 | Park et al. |
| 5,629,790 A | 5/1997 | Neukermans et al. |
| 5,638,084 A | 6/1997 | Kalt |
| 6,057,814 A | 5/2000 | Kalt |
| 6,075,639 A | 6/2000 | Kino et al. |
| 6,081,304 A | 6/2000 | Kuriyama et al. |
| 6,229,509 B1 | 5/2001 | Deluca et al. |
| 6,317,108 B1 | 11/2001 | Kalt |
| 6,557,279 B2 | 5/2003 | Araki et al. |
| 6,692,646 B2 | 2/2004 | Kalt et al. |
| 6,771,237 B1 | 8/2004 | Kalt |
| 6,887,575 B2 | 5/2005 | Neuman et al. |
| 6,897,786 B1 | 5/2005 | Kalt |
| 6,972,888 B2 | 12/2005 | Poll et al. |
| 7,056,588 B2 | 6/2006 | Neuman et al. |
| 7,085,609 B2 | 8/2006 | Bechtel et al. |
| 7,189,458 B2 | 3/2007 | Ferreira et al. |
| 7,198,851 B2 | 4/2007 | Lemmer et al. |
| 7,645,977 B2 | 1/2010 | Schlam et al. |
| 7,684,105 B2 | 3/2010 | Lamontagne et al. |
| 7,705,826 B2 | 4/2010 | Kalt et al. |
| 7,771,830 B2 | 8/2010 | Neuman et al. |
| 7,998,320 B2 | 8/2011 | Laird et al. |
| 8,035,075 B2 | 10/2011 | Schlam et al. |
| 8,134,112 B2 | 3/2012 | Schlam et al. |
| 8,415,194 B2 | 4/2013 | Krasnov et al. |
| 8,557,391 B2 | 10/2013 | Frank et al. |
| 8,668,990 B2 | 3/2014 | Broadway et al. |
| 8,736,938 B1 | 5/2014 | Schlam et al. |
| 8,809,674 B2 | 8/2014 | Krasnov et al. |
| 8,925,286 B2 | 1/2015 | Hagen et al. |
| 8,982,441 B2 | 3/2015 | Schlam et al. |
| 9,246,025 B2 | 1/2016 | Krasnov et al. |
| 9,312,417 B2 | 4/2016 | Vandal et al. |
| 9,419,151 B2 | 8/2016 | Krasnov |
| 9,556,066 B2 | 1/2017 | Frank et al. |
| 9,670,092 B2 | 6/2017 | Lemmer et al. |
| 9,691,917 B2 | 6/2017 | Krasnov |
| 9,695,085 B2 | 7/2017 | Lemmer et al. |
| 9,796,619 B2 | 10/2017 | Broadway et al. |
| 9,802,860 B2 | 10/2017 | Frank et al. |
| 2002/0144831 A1 | 10/2002 | Kalt |
| 2005/0079780 A1 | 4/2005 | Rowe et al. |
| 2008/0115428 A1 | 5/2008 | Schlam et al. |
| 2008/0145527 A1 | 6/2008 | Hagood et al. |
| 2010/0172007 A1 | 7/2010 | Schlam et al. |
| 2012/0092756 A1 | 4/2012 | Yoshida et al. |
| 2013/0188235 A1 | 7/2013 | Floyd et al. |
| 2013/0284253 A1 | 10/2013 | Krasnov |
| 2014/0144083 A1 | 5/2014 | Artwohl et al. |
| 2014/0202643 A1* | 7/2014 | Hikmet ............... G02B 26/02 160/5 |
| 2014/0272314 A1 | 9/2014 | Veerasamy |

FOREIGN PATENT DOCUMENTS

| | | |
|---|---|---|
| EP | 2750200 A2 | 7/2014 |
| JP | 2005-089643 | 4/1995 |
| JP | 10-249278 | 9/1998 |
| JP | 2016190430 A | 11/2016 |
| KR | 10-2009-0008928 | 1/2009 |
| KR | 10-2013-0011845 | 1/2013 |

OTHER PUBLICATIONS

U.S. Appl. No. 16/028,511, filed Jul. 6, 2018, Krasnov et al.
U.S. Appl. No. 16/028,546, filed Jul. 6, 2018, Blush et al.
U.S. Appl. No. 16/028,562, filed Jul. 6, 2018, Blush et al.
U.S. Appl. No. 16/028,578, filed Jul. 6, 2018, Blush et al.
U.S. Appl. No. 16/028,705, filed Jul. 6, 2018, Petrmichl et al.
U.S. Appl. No. 16/028,718, filed Jul. 6, 2018, Frey et al.
International Search Report and Written Opinion for International Application No. PCT/IB2019/055762, dated Dec. 5, 2019, pp. 10.
International Search Report and Written Opinion for International Application No. PCT/IB2019/055764, dated Dec. 5, 2019, pp. 10.
International Search Report and Written Opinion for International Application No. PCT/IB2019/055760, dated Dec. 5, 2019, pp. 10.
International Search Report and Written Opinion for International Application No. PCT/IB2019/055758, dated Dec. 5, 2019, pp. 11.

* cited by examiner

| | Density (Kg/m3) | Elastic Modulus (Gpa) | Modulus to Density | Poisson Ratio | CTE (10-6/k) | CTE PEN - CTE of X | Yield Strength (MPa) |
|---|---|---|---|---|---|---|---|
| PEN | 1360 | 6 | 0.004412 | 0.35 | 13-513 | 0 | 120 |
| Kapton | 1420 | 2.5 | 0.001761 | 0.34 | 20-? | - | 69 |
| Al | 2700 | 70 | 0.025926 | 0.34 | 23.5 | -10.5 | 80 |
| Cr | 7190 | 140-279 | 0.019471 | 0.21 | 4.9-6.2 | 8.1 | 140? |
| Ni | 8890 | 200 | 0.022497 | 0.31 | 13.3 | -0.3 | 150 |
| Ti | 4506 | 116 | 0.025743 | 0.32 | 8.6 | 4.4 | 181 |
| 304 SS | 8003 | 193 | 0.024116 | 0.275 | 16.9 | -3.9 | 241 |
| Ta | 16690 | 168 | 0.010066 | 0.34 | 6.3 | 6.7 | 170 |
| Mo | 10200 | 329 | 0.032255 | 0.31 | 4.8 | 8.2 | 415 |
| W | 19300 | 411 | 0.021295 | 0.28 | 4.5 | 8.5 | 550 |
Fig. 15
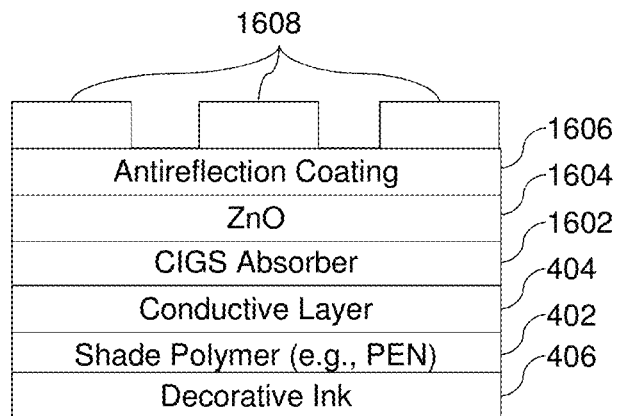
Fig. 16
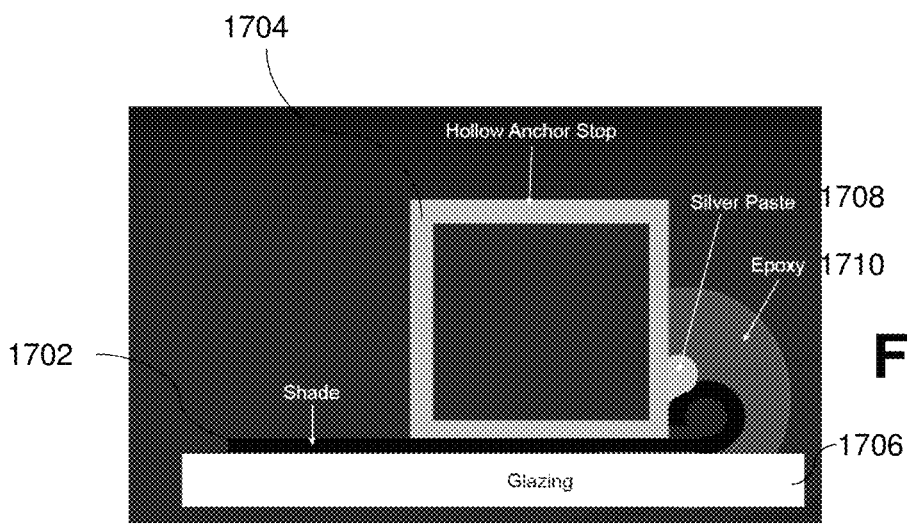
Fig. 17

ELECTRIC POTENTIALLY-DRIVEN SHADE WITH IMPROVED COIL STRENGTH, AND/OR METHOD OF MAKING THE SAME

TECHNICAL FIELD

Certain example embodiments of this invention relate to shades that may be used with insulating glass units (IG units or IGUs), IG units including such shades, and/or methods of making the same. More particularly, certain example embodiments of this invention relate to electric, potentially-driven shades that may be used with IG units, IG units including such shades, and/or methods of making the same.

BACKGROUND AND SUMMARY

The building sector is known for its high energy consumption, which has been shown to represent 30-40% of the world's primary energy expenditure. Operational costs, such as heating, cooling, ventilation, and lighting account for the better part of this consumption, especially in older structures built under less stringent energy efficiency construction standards.

Windows, for example, provide natural light, fresh air, access, and connection to the outside world. However, they oftentimes also represent a significant source of wasted energy. With the growing trend in increasing the use of architectural windows, balancing the conflicting interests of energy efficiency and human comfort is becoming more and more important. Furthermore, concerns with global warming and carbon footprints are adding to the impetus for novel energy efficient glazing systems.

In this regard, because windows are usually the "weak link" in a building's isolation, and considering modern architectural designs that often include whole glass facades, it becomes apparent that having better insulating windows would be advantageous in terms of controlling and reducing energy waste. There are, therefore, significant advantages both environmentally and economically in developing highly insulating windows.

Insulating glass units (IG units or IGUs) have been developed and provide improved insulation to buildings and other structures, and FIG. 1 is a cross-sectional, schematic view of an example IG unit. In the FIG. 1 example IG unit, first and second substrates 102 and 104 are substantially parallel and spaced apart from one another. A spacer system 106 is provided at the periphery of the first and second substrates 102 and 104, helping to maintain them in substantially parallel spaced apart relation to one another and helping to define a gap or space 108 therebetween. The gap 108 may be at least partially filled with an inert gas (such as, for example, Ar, Kr, Xe, and/or the like) in some instances, e.g., to improve the insulating properties of the overall IG unit. Optional outer seals may be provided in addition to the spacer system 106 in some instances.

Windows are unique elements in most buildings in that they have the ability to "supply" energy to the building in the form of winter solar gain and daylight year around. Current window technology, however, often leads to excessive heating costs in winter, excessive cooling in summer, and often fails to capture the benefits of daylight, that would allow lights to be dimmed or turned off in much of the nation's commercial stock.

Thin film technology is one promising way of improving window performance Thin films can, for example, be applied directly onto glass during production, on a polymer web that can be retrofitted to an already pre-existing window at correspondingly lower cost, etc. And advances have been made over the last two decades, primarily in reducing the U-value of windows through the use of static or "passive" low-emissivity (low-E) coatings, and by reducing the solar heat gain coefficient (SHGC) via the use of spectrally selective low-E coatings. Low-E coatings may, for example, be used in connection with IG units such as, for example, those shown in and described in connection with FIG. 1. However, further enhancements are still possible.

For instance, it will be appreciated that it would be desirable to provide a more dynamic IG unit option that takes into account the desire to provide improved insulation to buildings and the like, takes advantage of the ability of the sun to "supply" energy to its interior, and that also provides privacy in a more "on demand" manner. It will be appreciated that it would be desirable for such products to have a pleasing aesthetic appearance, as well.

Certain example embodiments address these and/or other concerns. For instance, certain example embodiments of this invention relate to electric, potentially-driven shades that may be used with IG units, IG units including such shades, and/or methods of making the same.

In certain example embodiments, an insulating glass (IG) unit is provided. First and second substrates each have interior and exterior major surfaces, and the interior major surface of the first substrate faces the interior major surface of the second substrate. A spacer system helps to maintain the first and second substrates in substantially parallel spaced apart relation to one another and to define a gap therebetween. A dynamically controllable shade interposed between the first and second substrates includes: a first conductive coating provided, directly or indirectly, on the interior major surface of the first substrate; a dielectric or insulator film provided, directly or indirectly, on the first conductive coating; and a shutter including a polymer material supporting a second conductive coating, the polymer material being extendible to serve as a shutter closed position and retractable to serve a shutter open position, wherein the second conductive coating includes a thin film layer comprising Mo and/or Ti. The first and second conductive coatings are electrically connectable to a power source that is controllable to selectively set up an electric potential difference to correspondingly drive the polymer material between the shutter open and closed positions.

In certain example embodiments, an insulating glass (IG) unit is provided. First and second substrates each have interior and exterior major surfaces, and the interior major surface of the first substrate faces the interior major surface of the second substrate. A spacer system helps to maintain the first and second substrates in substantially parallel spaced apart relation to one another and to define a gap therebetween. A dynamically controllable shade interposed between the first and second substrates includes: a first conductive coating provided, directly or indirectly, on the interior major surface of the first substrate; a dielectric or insulator film provided, directly or indirectly, on the first conductive coating; and a shutter including a polymer material supporting a second conductive coating, the polymer material being extendible to serve as a shutter closed position and retractable to serve a shutter open position, the second conductive coating comprising one or more thin film layers, the thin film layer(s) in the second conductive coating being selected and formed to cause the shutter to move between the opened and closed positions with a spring force greater than that of a shutter having a second conductive coating including only a layer comprising Al. The first and second conductive coatings are electrically connectable to a power source that is controllable to selectively set up an electric potential difference to correspondingly drive the polymer material between the shutter open and closed positions.

In certain example embodiments, a method of making an insulating glass (IG) unit is provided. The method comprises: providing first and second substrates, each having interior and exterior major surfaces; forming a first conductive coating, directly or indirectly, on the interior major surface of the first substrate; providing a dielectric or insulator film, directly or indirectly, on the first conductive coating; locating, adjacent to the dielectric or insulator film, a shutter including a polymer material supporting a second conductive coating, the polymer material in use being extendible to serve as a shutter closed position and retractable to serve as a shutter open position, the thin film layer(s) in the second conductive coating being selected and formed to cause the shutter to move between the opened and closed positions, the thin film layer(s) in the second conductive coating and/or the second conductive coating itself having a greater modulus and lower CTE than Al; electrically connecting the first and second conductive coatings to a power source, wherein the first conductive coating, dielectric or insulator film, and shutter at least partially form a dynamic shade that is controllable in connection with the power source to selectively set up an electric potential difference and correspondingly drive the polymer material between the shutter open and closed positions; and connecting the first and second substrates together in substantially parallel spaced apart relation to one another in connection with a spacer system such that the interior surfaces of the first and second substrates face one another in making the IG unit, a gap being defined therebetween, the dynamic shade being interposed between the first and second substrates in the gap.

In certain example embodiments, a method of operating a dynamic shade in an insulating glass (IG) unit is provided. The method comprises having an IG unit made in accordance with the techniques disclosed herein (e.g., in accordance with any one of the 20 previous paragraphs); and selectively activating the power source to move the polymer material between the shutter open and closed positions.

The features, aspects, advantages, and example embodiments described herein may be combined to realize yet further embodiments.

BRIEF DESCRIPTION OF THE DRAWINGS

These and other features and advantages may be better and more completely understood by reference to the following detailed description of exemplary illustrative embodiments in conjunction with the drawings, of which:

FIG. 15 is a table including coil strength related properties for several materials, which may be relevant in certain example embodiments;

FIG. 16 is a schematic view of a shutter incorporating a CIGS solar cell that may be used in connection with certain example embodiments;

FIGS. 17-19 show how the shade may be connected to a glazing and powered, in accordance with certain example embodiments;

DETAILED DESCRIPTION

Figure 1:
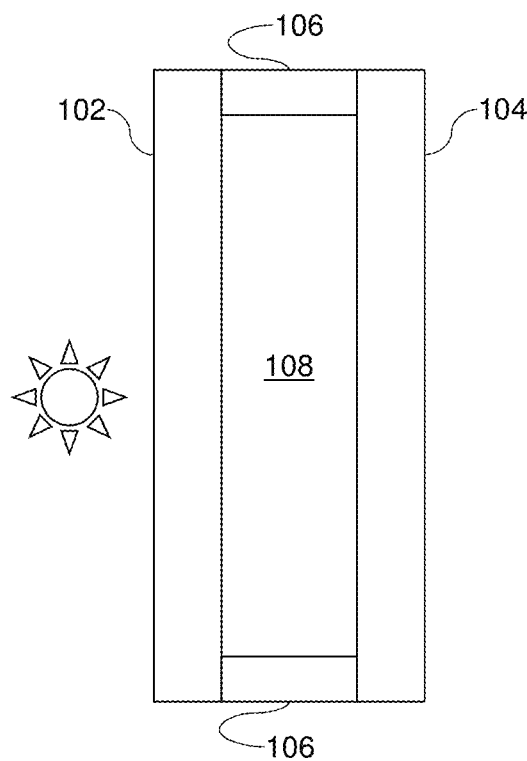
FIG. 1 is a cross-sectional, schematic view of an example insulating glass unit (IG unit or IGU)
Figure 2:
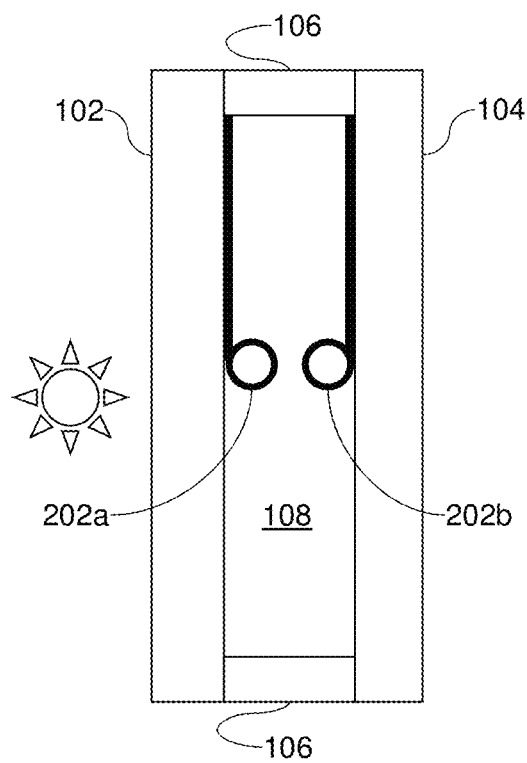
FIG. 2 is a cross-sectional, schematic view of an example IGU incorporating electric potentially-driven shades that may be used in connection with certain example embodiments.

Certain example embodiments of this invention relate to electric, potentially-driven shades that may be used with IG units, IG units including such shades, and/or methods of making the same. Referring now more particularly to the drawings, FIG. 2 is a cross-sectional, schematic view of an example insulating glass unit (IG unit or IGU) incorporating electric potentially-driven shades that may be used in connection with certain example embodiments. More specifically, FIG. 2 is similar to FIG. 1 in that first and second substantially parallel spaced apart glass substrates 102 and 104 are separated from one another using a spacer system 106, and a gap 108 is defined therebetween. First and second electric potentially-driven shades 202a and 202b are provided in the gap 108, proximate to inner major surfaces of the first and second substrates 102 and 104, respectively. As will become clearer from the description provided below, the shades 202a and 202b are controlled by the creation of an electric potential difference between the shades 202a and 202b, and conductive coatings formed on the inner surfaces of the substrates 102 and 104. As also will become clearer from the description provided below, each of shades 202a and 202b may be created using a polymer film coated with a conductive coating (e.g., a coating comprising a layer including Al, Cr, ITO, and/or the like). An aluminum-coated shade may provide for partial-to-complete reflection of visible light, and up to significant amounts of total solar energy.

The shades 202a and 202b are normally retracted (e.g., rolled up), but they rapidly extend (e.g., roll out) when an appropriate voltage is applied, in order to cover at least a portion of the substrates 102 and 104 much like, for example, a "traditional" window shade. The rolled-up shade may have a very small diameter, and typically will be much smaller than the width of the gap 108 between the first and second substrates 102 and 104, so that it can function between them and be essentially hidden from view when rolled up. The rolled-out shades 202a and 202b adhere strongly to the adjacent substrates 102 and 104.

The shades 202a and 202b extend along all or a portion of a vertical length of the visible or "framed" area of the substrates 102 and 104 from a retracted configuration to an extended configuration. In the retracted configuration, the shades 202a and 202b have a first surface area that substantially permits radiation transmission through the framed area. In the extended configuration, the shades 202a and 202b have a second surface area that substantially controls radiation transmission through the framed area. In certain example embodiments, the shades 202a and 202b may have a width that extends across all or a portion of the horizontal width of the framed area of the substrates 102 and 104 to which they are attached.

Each of the shades 202a and 202b is disposed between the first and second substrates 102 and 104, and each preferably is attached at one end to an inner surface thereof (or a dielectric or other layer disposed thereon), near the tops thereof. An adhesive layer may be used in this regard. The shades 202 and 204 are shown partially rolled out (partially extended) in FIG. 2. In certain example embodiments, the shades 202a and 202b and any adhesive layer or other mounting structure preferably are hidden from view so that the shades 202a and 202b are only seen when at least partially rolled out.

The diameter of a fully rolled-up shade preferably is about 1-5 mm but may be greater than 5 mm in certain example embodiments. Preferably, the diameter of a rolled-up shade is no greater than the width of the gap 108, which is typically about 10-15 mm, in order to help facilitate rapid and repeated roll-out and roll-up operations. Although two shades 202a and 202b are shown in the FIG. 2 example, it will be appreciated that only one shade may be provided in certain example embodiments, and it also will be appreciated that that one shade may be provided on an inner surface of either the inner or outer substrate 102 or 104. In example embodiments where there are two shades, the combined diameter thereof preferably is no greater than the width of the gap 108, e.g., to facilitate roll-out and roll-up operations of both shades.

An electronic controller may be provided to help drive the shades 202a and 202b. The electronic controller may be electrically connected to the shades 202a and 202b, as well as the substrates 102 and 104, e.g., via suitable leads or the like. The leads may be obscured from view through the assembled IG unit. The electronic controller is configured to provide an output voltage to the shades 202a and 202b. Output voltage in the range of about 100-500 V DC can be used for driving the shades 202a and 202b in certain example embodiments. An external AC or DC power supply, a DC battery, and/or the like may be used in this regard. It will be appreciated that higher or lower output voltage may be provided, e.g., depending on the fabrication parameters and materials that comprise the shades 202a and 202b, the layers on the substrates 102 and 104, etc.

The controller may be coupled to a manual switch, remote (e.g., wireless) control, or other input device, e.g., to indicate whether the shades 202a and 202b should be retracted or extended. In certain example embodiments, the electronic controller may include a processor operably coupled to a memory storing instructions for receiving and decoding control signals that, in turn, cause voltage to be selectively applied to control the extension and/or retraction of the shades 202a and 202b. Further instructions may be provided so that other functionality may be realized. For instance, a timer may be provided so that the shades 202a and 202b can be programmed to extend and retract at user-specified or other times, a temperature sensor may be provided so that the shades 202a and 202b can be programmed to extend and retract if user-specified indoor and/or outdoor temperatures are reached, light sensors may be provided so that the shades 202a and 202b can be programmed to extend and retract based on the amount of light outside of the structure, etc.

Although two shades 202a and 202b are shown in FIG. 2, as noted above, certain example embodiments may incorporate only a single shade. Furthermore, as noted above, such shades may be designed to extend vertically and horizontally along and across substantially the entire IG unit, different example embodiments may involve shades that cover only portions of the IG units in which they are disposed. In such cases, multiple shades may be provided to deliver more selectable coverage, to account for internal or external structures such as muntin bars, to simulate plantation shutters, etc.

In certain example embodiments, a locking restraint may be disposed at the bottom of the IGU, e.g., along its width, to help prevent the shades from rolling out their entire lengths. The locking restraint may be made from a conductive material, such as a metal or the like. The locking restraint also may be coated with a low dissipation factor polymer such as, for example, polypropylene, fluorinated ethylene propylene (FEP), polytetrafluoroethylene (PTFE), and/or the like.

Figure 3:
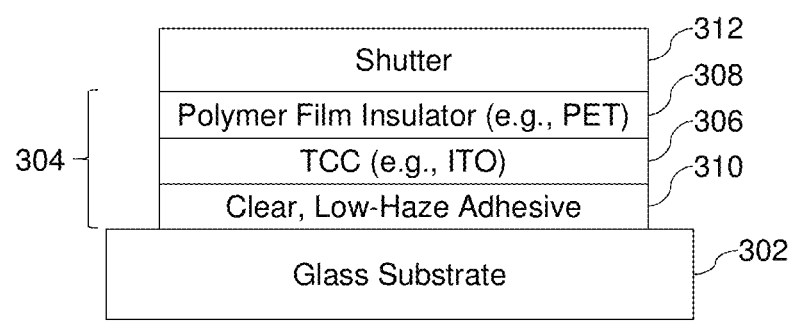
FIG. 3 is a cross-sectional view showing example "on-glass" components from the FIG. 2 example IGU that enable shutter action, in accordance with certain example embodiments.
Figure 4:
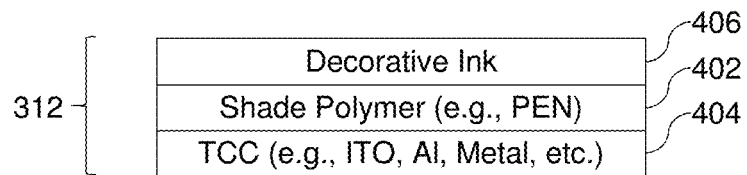
FIG. 4 is a cross-sectional view of an example shutter from the FIG. 2 example IGU, in accordance with certain example embodiments.

Example details of the operation of the shades 202a and 202b will not be provided in connection with FIGS. 3-4. More particularly, FIG. 3 is a cross-sectional view showing example "on-glass" components from the FIG. 2 example IGU that enable shutter action, in accordance with certain example embodiments; and FIG. 4 is a cross-sectional view of an example shutter from the FIG. 2 example IGU, in accordance with certain example embodiments. FIG. 3 shows a glass substrate 302, which may be used for either or both of the substrates 102 and 104 in FIG. 2. The glass substrate 302 supports on-glass components 304, as well as the shutter 312. In certain example embodiments, when unrolled, the conductor 404 may be closer to the substrate 302 than the ink layer 406. In other example embodiments, this arrangement may be reversed such that, for example, when unrolled, the conductor 404 may be farther from the substrate 302 than the ink layer 406.

The on-glass components 304 include a transparent conductor 306, along with a dielectric material 308, which may be adhered to the substrate 302 via a clear, low-haze adhesive 310 or the like. These materials preferably are substantially transparent. In certain example embodiments, the transparent conductor 306 is electrically connected via a terminal to a lead to the controller. In certain example embodiments, the transparent conductor 306 serves as a fixed electrode of a capacitor, and the dielectric material 308 serves as the dielectric of this capacitor.

The transparent conductor 306 may be formed from any suitable material such as, for example, ITO, tin oxide (e.g., $SnO_2$ or other suitable stoichiometry), etc. The transparent conductor 306 may be 10-500 nm thick in certain example embodiments. The dielectric material 308 may be a low dissipation factor polymer in certain example embodiments. Suitable materials include, for example, polypropylene, FEP, PTFE, polyethyleneterephthalate (PET), polyimide (PI), and polyethylenenapthalate (PEN), etc. The dielectric material 308 may have a thickness of 4-25 microns in certain example embodiments. The thickness of the dielectric material 308 may be selected so as to balance reliability of the shade with the amount of voltage (e.g., as thinner dielectric layers typically reduce reliability, whereas thicker dielectric layers typically require a high applied voltage for operational purposes).

As is known, many low-emissivity (low-E) coatings are conductive. Thus, in certain example embodiments, a low-E coating may be used in place of the transparent conductor 306 in certain example embodiments. The low-E coating may be a silver-based low-E coating, e.g., where one, two, three, or more layers comprising Ag may be sandwiched between dielectric layers. In such cases, the need for the adhesive 310 may be reduced or completely eliminated.

The shutter 312 may include a resilient layer 402. In certain example embodiments, a conductor 404 may be used on one side of the resilient layer 402, and a decorative ink 406 optionally may be applied to the other side. In certain example embodiments, the conductor 404 may be transparent and, as indicated, the decorative ink 406 is optional. In certain example embodiments, the conductor 404 and/or the decorative ink 406 may be translucent or otherwise impart coloration or aesthetic features to the shutter 312. In certain example embodiments, the resilient layer 402 may be formed from a shrinkable polymer such as, for example, PEN, PET, polyphenylene sulfide (PPS), polyether ether ketone (PEEK), etc. The resilient layer 402 may be 1-25 microns thick in certain example embodiments. The conductor 404 may be formed from the same or different material as that used for conductor 306, in different example embodiments. Metal or metal oxide materials may be used, for example. In certain example embodiments, a 10-50 nm thick material including a layer comprising, for example, ITO, Al, Ni, NiCr, tin oxide, and/or the like, may be used. In certain example embodiments, the resistance of the conductor 404 may be in the range of 40-200 ohms/square.

The decorative ink 406 may include pigments, particles, and/or other materials that selectively reflect and/or absorb desired visible colors and/or infrared radiation.

As FIG. 2 shows, the shades 202a and 202b ordinarily are coiled as spiral rolls, with an outer end of the spiral affixed by an adhesive to the substrates 102 and 104 (e.g., or the dielectric thereon). The conductor 404 may be electrically connected via a terminal to a lead or the like and may serve as a variable electrode of a capacitor having the conductor 306 as its fixed electrode and the dielectric 308 as its dielectric.

When an electrical drive is provided between the variable electrode and the fixed electrode, e.g., when an electric drive of voltage or current is applied between the conductor 404 of the shutter 312 and the conductor 306 on the substrate 302, the shutter 312 is pulled toward the substrate 302 via an electrostatic force created by the potential difference between the two electrodes. The pull on the variable electrode causes the coiled shade to roll out. The electrostatic force on the variable electrode causes the shutter 312 to be held securely against the fixed electrode of the substrate 302. As a result, the ink coating layer 406 of the shade selectively reflects or absorbs certain visible colors and/or infrared radiation. In this way, the rolled-out shade helps control radiation transmission by selectively blocking and/or reflecting certain light or other radiation from passing through the IG unit, and thereby changes the overall function of the IG unit from being transmissive to being partially or selectively transmissive, or even opaque in some instances.

When the electrical drive between the variable electrode and the fixed electrode is removed, the electrostatic force on the variable electrode is likewise removed. The spring constant present in the resilient layer 402 and the conductor 404 causes the shade to roll up back to its original, tightly-wound position. Because movement of the shade is controlled by a primarily capacitive circuit, current essentially only flows while the shade is either rolling out or rolling up. As a result, the average power consumption of the shade is extremely low. In this way, several standard AA batteries may be used to operate the shade for years, at least in some instances.

In one example, the substrate 302 may be 3 mm thick clear glass commercially available from the assignee. An acrylic-based adhesive having a low haze may be used for adhesive layer 310. Sputtered ITO having a resistance of 100-300 ohms/square may be used for the conductor 306. The polymer film may be a low-haze (e.g., <1% haze) PET material that is 12 microns thick. A PVC-based ink available from Sun Chemical Inc. applied to 3-8 microns thickness may be used as the decorative ink 406. A PEN material commercially available from DuPont that is 6, 12, or 25 microns thick may be used as the resilient layer 402. For an opaque conductor 406, evaporated Al that has a nominal thickness of 375 nm may be used. For a transparent option, sputtered ITO may be used. In both cases, the resistance may be 100-400 ohms/square. The ITO or other conductive material(s) may be sputtered onto, or otherwise formed on, their respective polymer carrier layers in certain example embodiments. Of course, these example materials, thicknesses, electrical properties, and their various combinations and sub-combinations, etc., should not be deemed limiting unless specifically claimed.

Further manufacturing, operation, and/or other details and alternatives may be implemented. See, for example, U.S. Pat. Nos. 8,982,441; 8,736,938; 8,134,112; 8,035,075; 7,705,826; and 7,645,977; the entire contents of each of which is hereby incorporated herein by reference.

Certain example embodiments may include microscopic perforations or through-holes that allow light to pass through the shade and provide progressive amounts of solar transmittance based on the angle of the sun. These perforations or holes may help shade the direct sun, progressively. The shading effects of the microscopic holes can be compared to that of exterior blinds, except that the holes remain invisible, as they are formed to be too small for the human eye to see, in certain example embodiments. The holes' size, distribution, and angle may be designed to control the amount solar energy allowed into the building during different times of the year. For instance, in the summer, where the sun is high in the sky, the holes' size, distribution, and angle may help ensure that solar transmittance from the sunlight is reduced while still allowing some light into the building. By contrast, the holes may be designed such that the shade allows solar transmittance in the winter, which reduces the need for heating during the cold period. For instance, through hole design, it may be possible to reduce the amount of energy from sunlight passing through the IG unit by up to about 90% in the summer (and sometimes even more), while also allowing for about 35% of solar transmittance in the winter (and sometimes even more). The perforations thus may be used to provide a passive approach to solar control in connection with the more active and dynamic use of the electrostatically driven shade. In certain example embodiments, hole design may enable a reduction in the amount of energy from sunlight passing through the IG unit in the summer of at least 50%, more preferably at least 60%, still more preferably at least 75%, and sometimes 80-90% or more. In addition, or in the alternative, in certain example embodiments, hole design may enable transmission of energy from sunlight passing through the IG unit in the winter of at least 20%, more preferably at least 25%, and sometimes 30-35% or more. In certain example embodiments, a single hole design may enable a difference in transmission of energy from sunlight passing through the IG unit between the summer and winter of at least about 30%, more preferably at least about 40%, and still more preferably at least about 50-55% and sometimes even more.

It will be appreciated that the size, shape, and/or arrangement of the holes may be based on, for example, the approximate latitude at which the IGU is to be installed, the orientation of the IGU in the location (e.g., whether the IGU is upright as for a door or window, flat or angled as for a skylight, etc.), etc. Different angles for the holes may, for example, be tuned in these and/or other regards, e.g., to provide for improved shading coefficients, light-to-solar gain values, etc.

Moreover, with respect to hole size, diameter, angle, etc., it will be appreciated that thickness (T) of the dynamic shade may be 10-32 um in certain example embodiments. The size of the hole diameter or major distance (D) may depend on that thickness in some instances. For example, the hole diameter or major distance in certain example embodiments may be between 0.5 T and 5 T. It will be appreciated that 0.5 T equates to direct sunlight not passing through the film at an angle of greater than 26.5 degrees to the horizon. This assumes that the hole angle is perpendicular to the outboard face of the dynamic shade. The amount of light is dependent on the diameter of the hole, the thickness of the dynamic shade, the angle of the holes and the number of holes. Angling the hole downward allows for similar light blocking capabilities, but the hole then can be larger in size, thereby allowing for more indirect light penetration. It is possible to angle the holes in such a fashion that no direct light goes through shade. In a case where D=T the holes should be at offset 45 degrees (up or down) from perpendicular. That angle increases if D>T.

Figure 5:
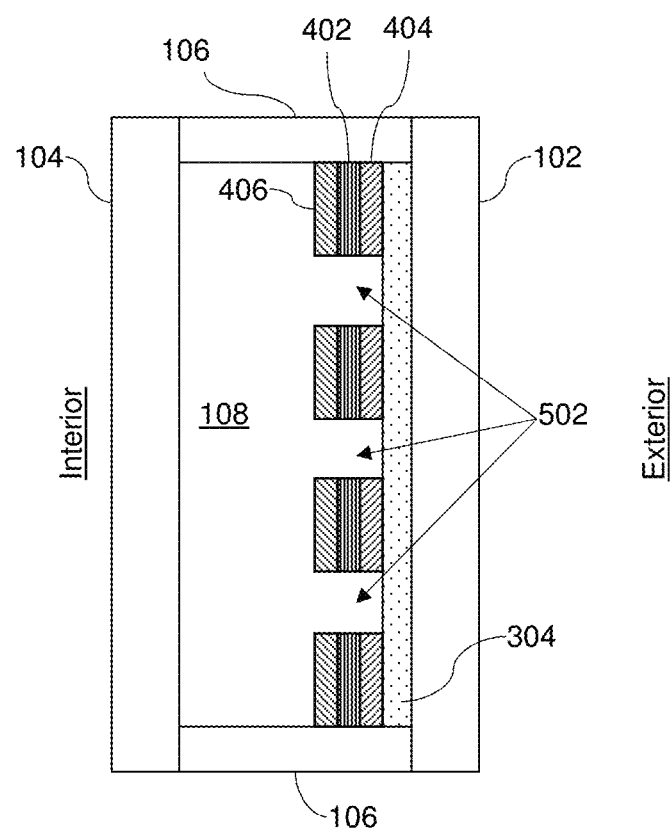
FIG. 5 is a cross-sectional, schematic view of an example IGU including an electric potentially-driven shade incorporating perforations, which may be used in connection with certain example embodiments.

FIG. 5 is a cross-sectional, schematic view of an example IGU incorporating an electric potentially-driven shade including perforations 502, which may be used in connection with certain example embodiments. As shown in FIG. 5, the holes are formed in the shutter 312 portion of the shade. That is, the holes 502 extend through the decorative ink 406, resilient polymer 402, and the transparent conductor 404 thereon. The holes 502 need not, however, extend through the lower on-glass portion 304 of the shade in certain example embodiments. This may be advantageous from a manufacturing perspective, as the on-glass portion 304 may be formed separately from the shutter 312 portion, in some instances. Moreover, in certain example embodiments, the on-glass portion 304 may use blanket coating processes such as sputtering or the like, whereas the shutter 312 portion may include additional steps practiced after the resilient polymer 402 is coated with the transparent conductor 404 and/or ink 406.

In certain example embodiments, the holes 502 in the shutter 312 portion may be formed by any suitable technique. For example, micro-holes may be formed by laser cutting, stamping, punch-cutting, a photolithographic approach, a drilling approach (such as, for example, physical drilling, electron beam drilling, etc.), and/or the like. The holes may be formed to have a cross-section that is substantially circular, rectangular, etc. In certain example embodiments, the hole diameter or major distance will be approximately the thickness of the entire shade and, thus, approximately 10-30 microns. In certain example embodiments, 30-70% of the shutter 312 portion may be removed as a result of hole formation, more preferably 40-60% of the shutter 312 portion may be removed as a result of hole formation, and in some instances about 50% of the shutter 312 portion may be removed as a result of hole formation. In certain example embodiments, no more than 50% of the shutter 312 portion is removed as a result of hole formation. In certain example embodiments, the holes modify the color rendering index (CRI) value of the overall shade preferably by no more than 10, more preferably by no more than 5, still more preferably by no more than 2-3, and sometimes by no more than 1 (e.g., by no more than 0.5).

Although certain example embodiments have been described as involving through-holes, different embodiments may involve holes that extend only partially through the shutter 312. In certain example embodiments, the holes may be formed by providing multiple lamellas stacked one on top of another. In such cases, holes in adjacent lamella layers may or may not partially or fully overlap with one another. For instance, multiple lamella layers may fully overlap with one another to in essence form a through hole in one example, whereas another example may involve adjacent lamella layers may only partially overlap with one another to in essence form an angled through hole. In another example, multiple lamella layers may not overlap with one another. In certain example embodiments, multiple lamellas may be stacked up to form (or in essence take the place of a separate) shutter 312.

Figure 6B:
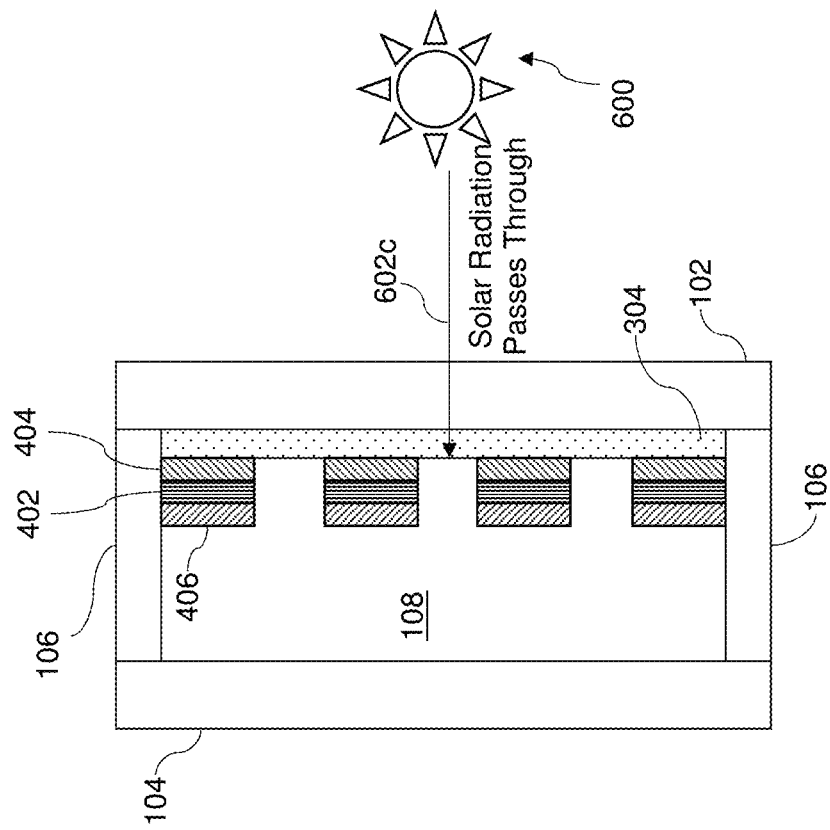
FIGS. 6a-6b demonstrate how solar radiation can be selectively reflected in connection with the FIG. 5 example IGU, in certain example instances.
Figure 6A:
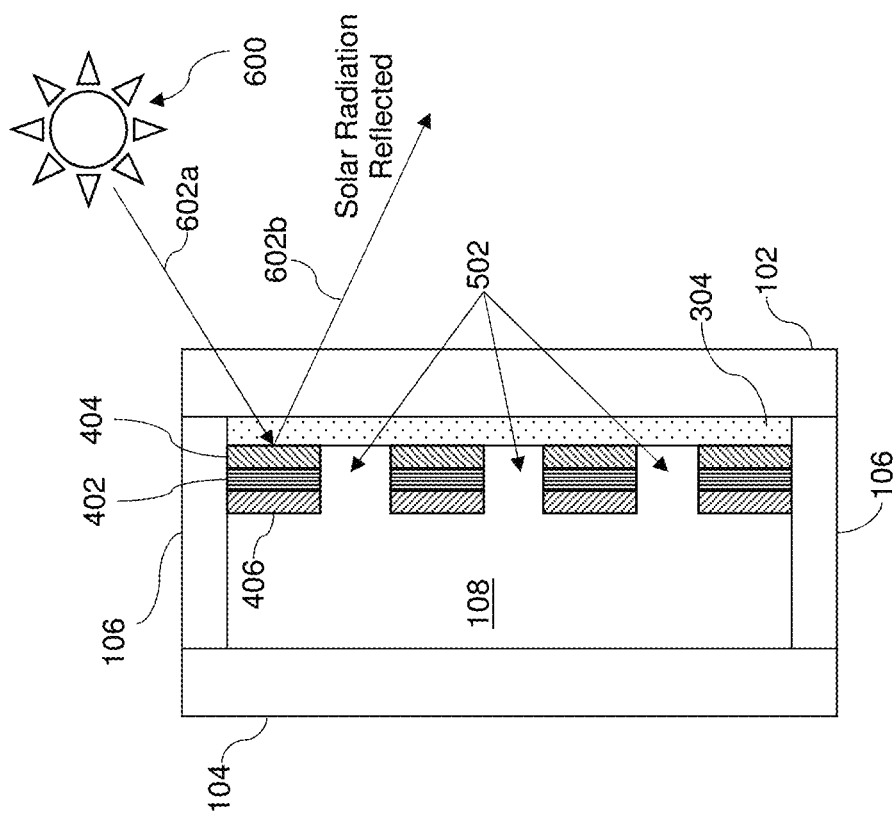

FIGS. 6a-6b demonstrate how solar radiation can be selectively reflected in connection with the FIG. 5 example IGU, in certain example instances. As shown in FIG. 6a, for example, when the sun 600 is high (e.g., in summer months), solar radiation 602a is more likely to encounter a non-removed portion of the shutter 312 of the extended shade, as compared to the holes 502 formed therein. Thus, a substantial amount of solar radiation is reflected 602b (and/or absorbed, depending on the example embodiment). By contrast, as shown in FIG. 6b, when the sun 600 is lower in the sky (e.g., in winter months), solar radiation 602c is more likely to pass through the holes 502 formed in the shutter 312 portion of the shade.

Figure 7:
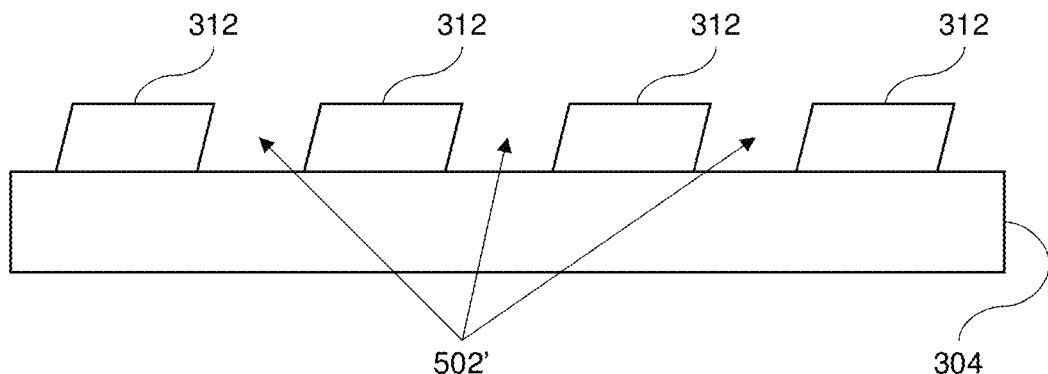
FIG. 7 is a cross-sectional view showing an alternative geometry for the perforations formed in the FIG. 5 example shade, in accordance with certain example embodiments.

FIG. 7 is a cross-sectional view showing an alternative geometry for the perforations formed in the FIG. 5 example shade, in accordance with certain example embodiments. In certain example embodiments, the holes formed in the shutter 312 portion of the shade may be angled. FIG. 7, for example, shows the holes 502' formed in the shutter 312 being angled. This may aid in selective transmission through the shade in certain example embodiments.

As will be appreciated from the description above, the dynamic shade mechanism uses a coiled polymer with a conductive layer. In certain example embodiments, the conductor 402 may be formed to be integral with the polymer 402, or it may be an extrinsic coating that is applied, deposited, or otherwise formed on the polymer 402. As also mentioned above, decorative ink 406 may be used together with a transparent conductor material (e.g., based on ITO) and/or an only partially transparent or opaque conductive layer. An opaque or only partially transparent conductive layer may obviate the need for ink in certain example embodiments. In this regard, a metal or substantially metallic material may be used in certain example embodiments. Aluminum is one example material that may be used with or without a decorative ink.

The use of aluminum may be seen to be advantageous in some instances because it provides excellent conductivity (low resistivity) and high levels of reflectivity with respect to incident light from the sun, both in the visible and infrared spectra. Yet one issue with the use of a metal or substantially metallic layer (such as a layer comprising or consisting essentially of aluminum) is that the internal reflection (and particularly the specular reflection) from it may be aesthetically unpleasing. Additionally, even when reflection is not a problem, the inclusion of the layer may result in a displeasing coloration for a viewer on the interior-facing side of the IGU.

Antireflection (AR) techniques are known and are used in connection with certain coated articles. Typically, a layer or series of layers can be deposited on top of the surface whose reflection is to be reduced. Such techniques oftentimes use an optical interference model, e.g., where high and low index of refraction materials are provided over the surface whose reflection is to be reduced, typically in an alternating manner. Unfortunately, however, reducing the reflection of a "very shiny" metal such as that resulting from an aluminum, chrome, molybdenum, or otherwise coated surface presents heightened technical challenges. Reducing the reflection of the surface of uncoated glass from about 10% to about 1%, for example, can be complicated but can nonetheless be accomplished using the optical interference technique described above. Yet reducing the reflection of an aluminum-coated surface, which might have a reflection of about 90%, to as low as possible is even more complicated, and standard techniques (including standard materials) may not work as intended and as otherwise expected based on typical coated article experience. Maintaining consistency of coloration and/or consistency of coloration changes across visible wavelengths also can be very challenging when working with, and trying to reduce the reflection of, a highly-reflective material like aluminum. Indeed, there are good reasons why aluminum is oftentimes used in mirror coatings.

Figure 8A:
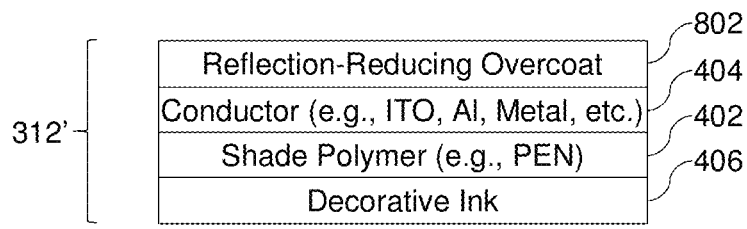
FIGS. 8a-8c are cross-sectional views of shutters similar to the FIG. 3 example, except that overcoats are included to improve the aesthetic appearance of the overall shade, in accordance with certain example embodiments.
Figure 8B:
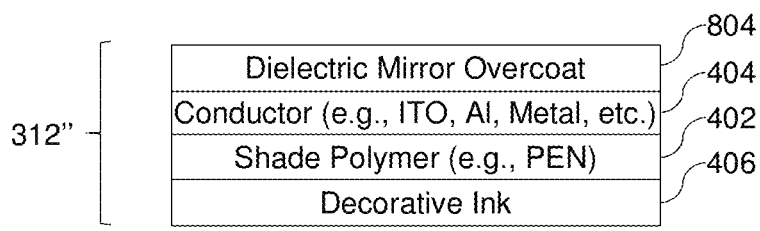
Figure 8C:
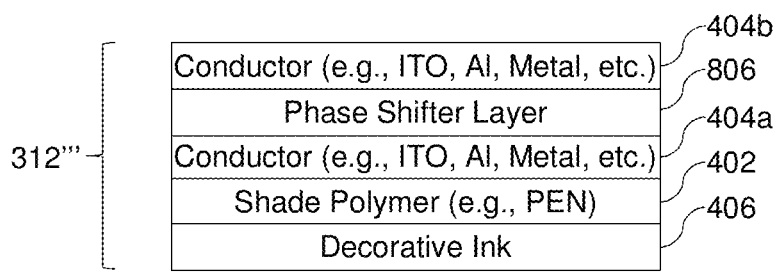

Certain example embodiments help address these concerns by providing one or more overcoat layers on the conductor to help reduce the visible light reflection and/or change the color of the shade to provide a more aesthetically pleasing product, and/or by "splitting" the conductor so that a phase shifter layer appears therebetween. In this regard, FIGS. 8a-8c are cross-sectional views of shutters similar to the FIG. 3 example, except that overcoats are included to improve the aesthetic appearance of the overall shade, in accordance with certain example embodiments. The shutter 312' of FIG. 8a includes a reflection-reducing overcoat 802, whereas the shutter 312" of FIG. 8b includes a dielectric mirror overcoat 804. As shown in FIGS. 8a-8b, the reflection-reducing overcoat 802 and the dielectric mirror overcoat 804 are provided over a conductor 404 and on a major surface of the shade polymer 402 comprising (for example) PEN opposite decorative ink 406. It will be appreciated, however, that the ink 406 need not be provided, e.g., if the conductor 404 is not transparent. Mirror coatings such as, for example, Al, may obviate the need for decorative ink 406. It also will be appreciated that the reflection-reducing overcoat 802 and the dielectric mirror overcoat 804 may be provided on major surfaces of the shade polymer 402 comprising (for example) PEN opposite the conductor 404 in certain example embodiments.

A variety of materials may be used for the reflection-reducing overcoat 802 and the dielectric mirror overcoat 804. Single layers that may be used for the reflection-reducing overcoat 802 may include, for example, layers comprising or consisting essentially of Ni, Cr, NiCr, NiCrOx, Inconel, amorphous silicon (a-Si), arc carbon, tetrahedral amorphous Carbon (Ta—C), Sb, Ti, NiTi, NiTiOx, and/or the like. In general, such layers may be formed to a thickness of 5-100 nm, more preferably 5-60 nm, still more preferably 10-60 nm, and sometimes 20-50 nm or 30-50 nm. More specific examples will be provided below.

The same or similar materials may be used in connection with the dielectric mirror overcoat 804. For instance, in certain example embodiments, a layer stack comprising a layer of Al sandwiched between layers comprising an oxide of Ni, Ti, and/or Cr (e.g., layers comprising NiCrOx) may be used in certain example embodiments.

FIG. 8c is a shutter similar to FIG. 3, except that a phase shifter layer 806 in essence "splits" the conductive layer, in accordance with certain example embodiments. In other words, as can be seen from FIG. 8c, first and second conductive layers 404a and 404b sandwich a phase shifter layer 806 in forming shutter 312". The same or similar materials and/or material thicknesses as those mentioned above in connection with the FIGS. 8a-8b examples may be used in connection with the FIG. 8c example. For instance, the first and second conductive layers 404a and 404b may comprise or consist essentially of a metal such as Al or Ni, NiCr, tin oxide, ITO, and/or the like. The phase shifter layer 806 may comprise or consist essentially of Ni, Cr, and/or Ti or an oxide of thereof. Titanium nitride and titanium oxynitride also may be used in connection with the phase shifter layer 806. The phase shifter layer 806 works in connection with the first and second conductor conductive layers 404a and 404b and may be thought of as a reflection-reducing layer. More particularly, having a phase shifter between one completely reflecting and one partially reflecting layer advantageously creates two identical intensities of the light and simply phase shifts them to obtain an at least partial cancellation effect. It will be appreciated that the lower conductive layer 404a may be conductive in certain example embodiments. In certain example embodiments, the stack including the phase shifter layer 806 and the conductive layers 404a and 404b may be conductive. As indicated above, different levels of reflectivity may be provided for the first and second conductive layers 404a and 404b, although this need not necessarily be the case in all example embodiments. In certain example embodiments, the level of reflectivity may be tuned based on the thickness of the coatings (e.g., thicker coatings tend to be more reflective). In certain example embodiments, the first conductive layer 404a may be thinner and/or less reflective than the second conductive layer 404b, e.g., so as to permit light to be absorbed by the decorative ink 406. This arrangement may be reversed in certain example embodiments.

In general, spectral reflection also can be adjusted by reducing total reflection and/or moving the layer from a specular reflective material to a diffuse reflecting material. The following techniques may be used in this regard, and may be used in any suitable combination, sub-combination, or combination of sub-combinations with each other and with the FIG. 8a-8c approaches. A first technique involves roughening the upper surface of the conductive (oftentimes metallic) layer by sand, bead, grit, or other blasting, through laser ablation, imprinting using a stamp or the like, etc. This may help to increase the surface roughness of the conductive layer and create a desired diffuse reflective effect. In certain example embodiments, the surface roughness (Ra) is less than 3.2 µm.

Another approach that may be used involves chemical (e.g., acid) etching of the conductive that adds pits and therefore increases the surface roughness. Still another approach involves imprinting the polymer substrate with various patterns, prior to coating the material with the conductive coating. Doing so may help increase the surface roughness of the polymer substrate and, with a generally conformal thin film formation process such as sputtering or the like, the texture of the polymer substrate can in effect be transferred to the conductive coating. This can be accomplished during a calendaring process, e.g., where the rolls that the polymer film go through have a pattern that is transferred to the polymer substrate. When a physical texturing approach like this is used, the first and/or second major surfaces of the polymer substrate may be patterned to have a texture in a predefined pattern, e.g., with that pattern being defined at least in part in terms of textural features to be imparted to the polymer material. In this sense, the depth of the features may be predefined. In addition, in certain example embodiments, the predefined pattern may be defined at least in part with respect to the area extending across the polymer substrate. In certain example embodiments, a fractal pattern may be used. It will be appreciated that stamping, punching, and/or the like may be used in addition to, or in place of, the calendaring.

When a metallic layer such as aluminum is used, it may be anodized. The anodizing of the metallic layer may help roughen the surface and add color, as well, which may be advantageous in certain example embodiments.

Still another approach involves applying an ink directly or indirectly to the surface of the conductive layer. The ink may or may not be continuous. Currently, a PVC-based ink is applied to the polymer substrate on the side opposite the conductive layer. However, putting an ink on the conductive layer would help lower reflection and create another avenue for adding different colors, images, and/or the like, to the shutter. The ink here may be used in place of, or together with, the ink on the opposite side of the polymer substrate.

In a nutshell, in addition to or in place of using optical interference techniques to reduce reflection, it also is possible to add a textured surface to the base polymer, modifying the conductive layer chemically or physically, and/or add an ink layer, e.g., to accomplish the same or similar ends, achieve further reductions in unwanted reflection, etc.

Figure 9:
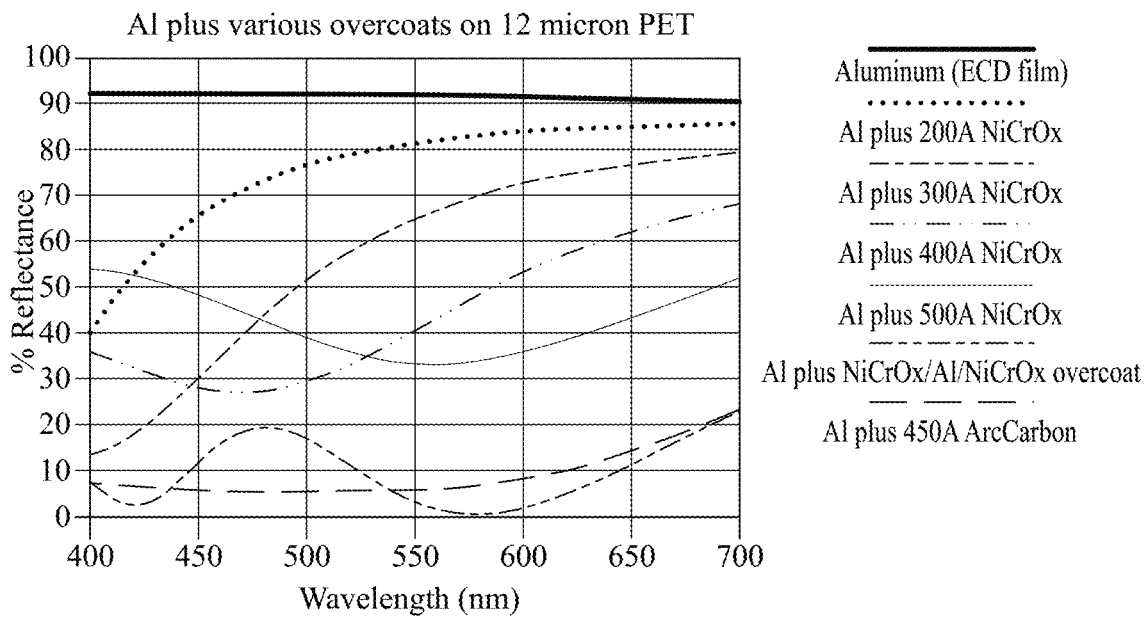
FIGS. 9-11 are graphs plotting percent reflectance vs. wavelength for certain example overcoat materials that may be used in connection with the FIG. 8a-8b layer stacks, in certain example embodiments.
Figure 10:
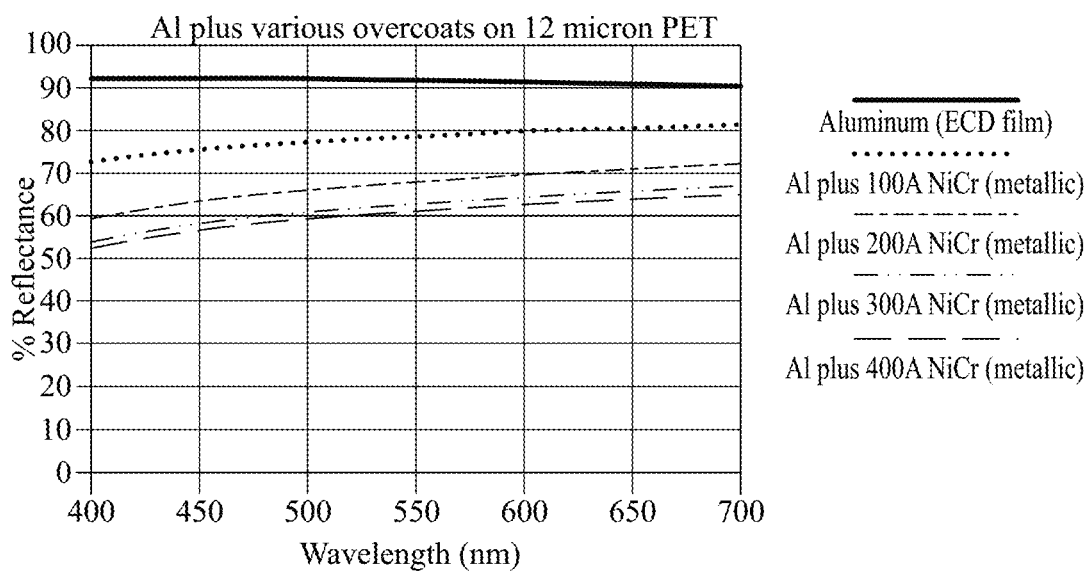
Figure 11:
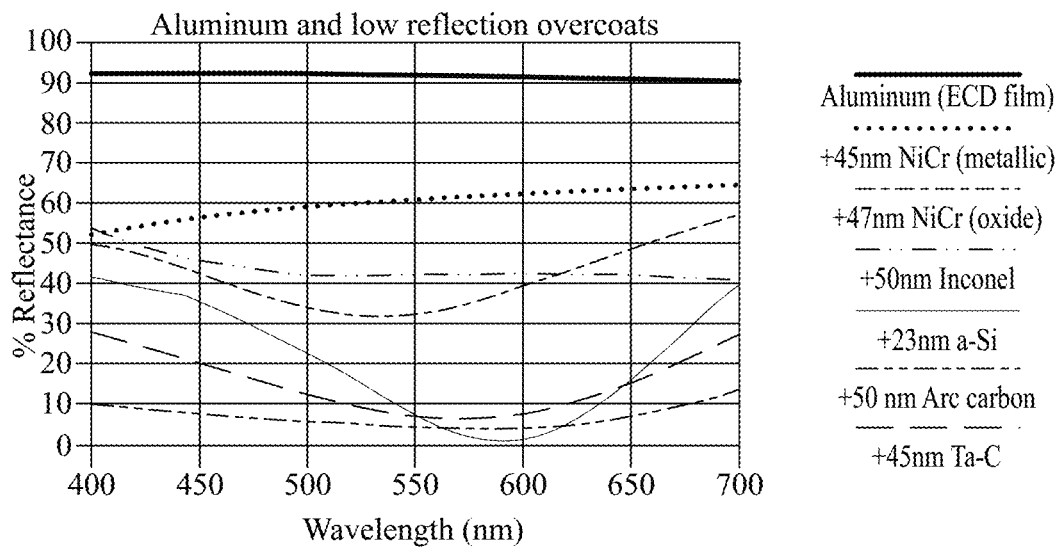

FIGS. 9-11 are graphs plotting percent reflectance vs. wavelength for certain example overcoat materials that may be used in connection with the FIG. 8a-8b layer stacks, in certain example embodiments. The data shown in these graphs are modelled. Each of FIGS. 9-11 shows the reflection of bare aluminum on a 12 micron thick PET sheet, as a function of wavelength. The aluminum may be deposited via an evaporative technique, electrochemical deposition, and/or the like. These graphs also show the reflection of a layer stack including the same aluminum layer overcoated with a single layer coating of various materials (with the exception of the overcoated NiCrOx/Al/NiCrOx layer stack).

The thickness of these layers has been selected to achieve as low a reflection as possible, while at the same time minimizing the reflected color change. As can be appreciated from these graphs, low-reflectivity and pan-chromaticism are difficult to achieve simultaneously. The best curve is achieved with arc carbon, a material which is not sputtered but instead may be formed by striking an arc by passing large currents through a pure carbon rod that is pressed against a carbon plate. Although this material is desirable from reflectivity and chromaticism perspectives, it may not be feasible for large-scale production. However, Ta—C approximates the performance of arc carbon, and Ta—C can be sputtered using, for example, a graphite target. A layer comprising Ta—C therefore may be desirable in certain example embodiments. Further findings concerning overcoat materials are presented below.

An overcoat layer comprising NiCrOx was formed on a layer comprising Al, reducing reflection as shown in FIGS. 9 and 11. Thicknesses for the overcoat layer comprising NiCrOx ranged generally from 20-60 nm, with specific examples including 20 nm, 30 nm, 40 nm, 45 nm, 47 nm, 49 nm, 50 nm, and 57 nm. In certain example embodiments, an 80Ni-20Cr target may be used, and this target was assumed for purposes of the simulations shown in FIGS. 9 and 11. The oxygen content can be modified to produce a varying array of colors, while still being conductive. A 50-60 nm thick sample film was formed over a layer comprising Al, and the color of the film was a blue-purple color, which shows good agreement with the models. In this case is used. Alternate stoichiometry of NiCr may produce different results in different example embodiments.

To further reduce the reflection of visible light off the shade, additional layers of NiCrOx and Al can be applied on the shade. That is, a layer comprising Al was sandwiched between layers comprising NiCrOx, and this three-layer stack was applied over the conductive layer comprising Al. Modeling was completed to optimize the layers to produce a low reflectance top coat surface. The results of the model can be seen in FIG. 9. The total reflectance was less than 15%. In this case, 80Ni-20Cr was used, although alternate stoichiometry for the NiCr may produce different results. As above, the oxygen content can be modified to produce a varying array of colors, while still being conductive. In certain example embodiments, a layer stack comprising NiCrOx/Al/NiCrOx may have a total thickness of 3-60 nm, more preferably 3-30 nm, and still more preferably 3-15 nm. In certain example embodiments, monolayers comprising NiCrOx, Al, or the like may be 3-15 nm thick.

Another method to significantly reduce the total visible light reflectance of the aluminum layer involves the addition of a carbon overcoat. The application of carbon via cathodic arc deposition was modelled to determine the reduction of visible light reflection and can be seen in FIGS. 9 and 11. The optimized model predicts a total reflectance of less than 10%. Example thicknesses are in the range of 30-60 nm, with specific examples of 45 nm and 50 nm.

A layer comprising metallic NiCr also can be deposited over the conductive layer comprising Al to reduce the total visible light reflection. FIG. 10 shows the modelled performance of layers that are 10 nm thick, 20 nm thick, 30 nm thick, and 40 nm thick. FIG. 11 shows an example that is 43 nm thick, and 45 nm and 47 nm thick samples also are specifically contemplated.

As noted above, other materials that may be used in single layer or other overcoats include: a-Si (e.g., 20-30 nm thick and, for example, 21 nm thick, 23 nm thick as shown in FIG. 11, and 25 nm thick); Inconel such as, for example, Inconel 600 (e.g., 40-60 nm thick and, for example, 47 nm thick, 50 nm thick as shown in FIG. 11, and 53 nm thick); and Ta—C (e.g., 20-60 nm thick, with specific examples being 39 nm thick, 41 nm thick, 43 nm thick, 45 nm thick as shown in FIG. 11, 47 nm thick, and 49 nm thick). Layers comprising Sb and/or Ti also may be used at the general thicknesses described above and may be useful in achieving low reflection and good coloration. As is known, Inconel is a family of austenitic nickel-chromium-based super-alloys that are oxidation-corrosion-resistant materials. Inconel 600 includes (by mass) 72.0% Ni, 14.0-17.0% Cr, 6.0-10.0% Fe, 1.0% Mn, 0.5% Cu, 0.5% Si, 0.15% C, and 0.015% S.

In certain example embodiments, through the use of overcoats of the type described herein and/or other overcoats, internal reflection preferably is reduced to less than 60% over all or substantially all of a wavelength range of 400-700 nm, more preferably less than 50% over all or substantially all of a wavelength range of 400-700 nm, and still more preferably less than 30-40% over all or substantially all of a wavelength range of 400-700 nm. Sometimes, internal reflection is reduced to less than 20% over all or substantially all of a wavelength range of 400-700 nm (e.g., as may be the case with a carbon-based overcoat). Preferably, the amount of reflection varies by no more than 30% points over all or substantially all of a wavelength range of 400-700 nm, more preferably by no more than 20% points over all or substantially all of a wavelength range of 400-700 nm, and sometimes by no more than 10-15% points over all or substantially all of a wavelength range of 400-700 nm.

An oxygen plasma and/or other cleaning process may be used on the polymer 402, e.g., prior to formation of the conductor layer 404, in certain example embodiments.

Given that the thin film and/or other materials comprising the shutter should survive numerous rolling and unrolling operations in accordance with the functioning of the overall shade, it will be appreciated that the materials may be selected, and that the overall layer stack formed, to have mechanical and/or other properties that facilitate the same. For example, an excess of stress in a thin film layer stack typically is seen as disadvantageous. However, in certain example embodiments, excess stress can lead to cracking, "delamination"/removal, and/or other damage to the conductor 404 and/or an overcoat layer or layers formed thereon. Thus, low stress (and in particular low tensile stress) may be particularly desirable in connection with the layer(s) formed on the shutters' polymer bases in certain example embodiments.

In this regard, the adhesion of sputtered thin films depends on, among other things, the stress in the depositing film. One way stress can be adjusted is with deposition pressure. Stress versus sputter pressure does not follow a monotonic curve but instead inflects at a transition pressure that in essence is unique for each material and is a function of the ratio of the material's melting temperature to the substrate temperature. Stress engineering can be accomplished via gas pressure optimizations, bearing these guideposts in mind.

Other physical and mechanical properties of the shade that may be taken into account include the elastic modulus of the polymer and the layers formed thereon, the density ratio of the layers (which may have an effect on stress/strain), etc. These properties may be balanced with their effects on internal reflection, conductivity, and/or the like.

As is known, temperatures internal to an IG unit may become quite elevated. For example, it has been observed that an IG unit in accordance with the FIG. 2 example and including a black pigment may reach a temperature of 87 degrees C., e.g., if the black portion of the shade is facing the sun in elevated temperature, high solar radiation climates (such as, for example, in areas of the southwest United States such as Arizona). The use of a PEN material for the rollable/unrollable polymer may be advantageous, as PEN has a higher glass transition temperature (~120 degrees C.), compared to other common polymers such as PET (Tg=67-81 degrees C.), Poly Propylene or PP (Tg=~32 degrees C.). Yet if the PEN is exposed to temperatures approaching the glass transition temperature, the performance of the material's otherwise advantageous mechanical properties (including its elastic modulus, yield strength, tensile strength, stress relaxation modulus, etc.) may degrade overtime, especially with elevated temperature exposure. If these mechanical properties degrade significantly, the shade may no longer function (e.g., the shade will not retract).

Figure 12:
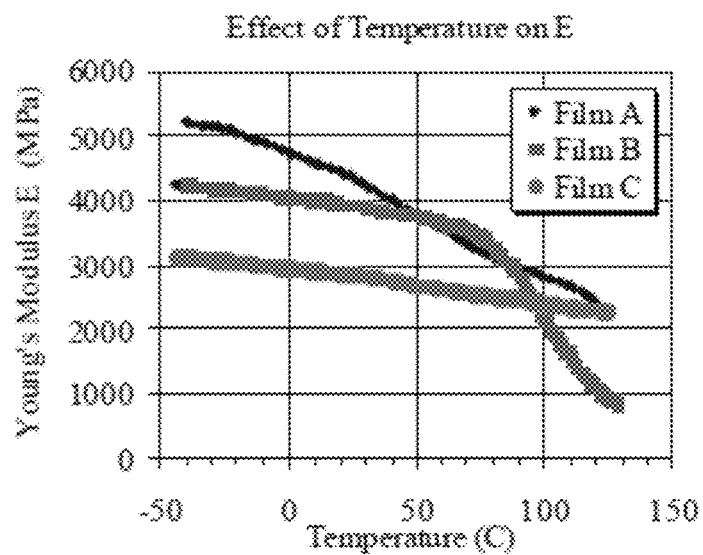
FIG. 12 is a graph demonstrating the effect of temperature on Young's modulus.
Figure 13:
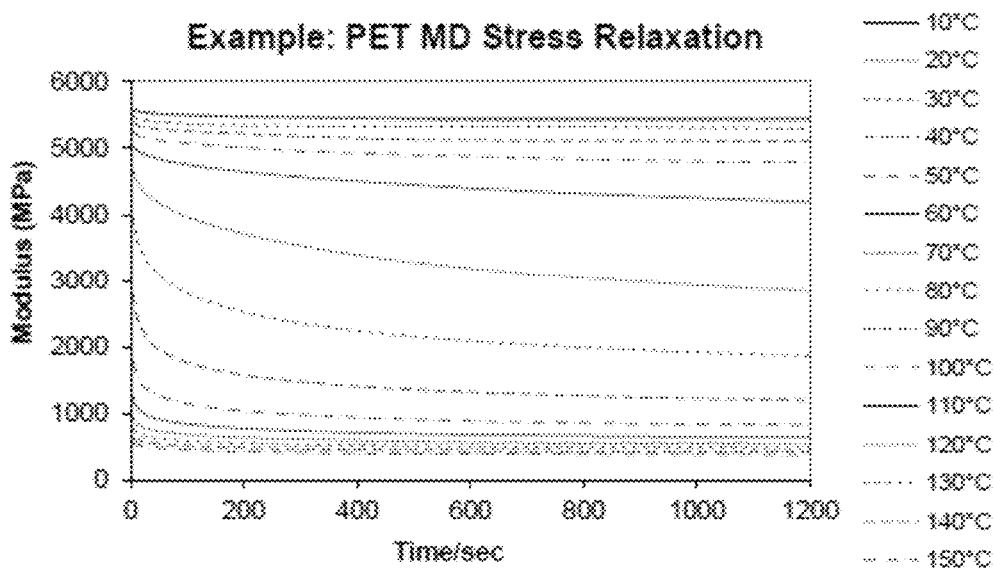
FIG. 13 shows typical stress relaxation curves for a PET film at different temperatures.

FIGS. 12-13 help demonstrate these points. More particularly, FIG. 12 demonstrates the effect of temperature on Young's modulus in that it is a graph plotting Young's modulus vs. temperatures for different polymer materials, and FIG. 13 is shows typical stress relaxation curves for a PET film at different temperatures. In FIG. 12, film A is PEN, film B is PET, and film C is PI. In general, polymers materials with higher glass transition temperatures have improved elevated temperature mechanical properties.

In order to help the shade better withstand elevated temperature environments, a substitution from PEN to polymers with better elevated temperature resistance may be advantageous. Two potential polymers include PEEK and Polyimide (PI or Kapton). PEEK has a Tg of ~142 degrees C. and Kapton HN has a Tg of ~380 degrees C. Both of these materials have better mechanical properties in elevated temperature environments, compared to PEN. This is especially true at temperature above 100 degrees C. The following chart demonstrates this, referencing mechanical properties of PEN (Teonex), PEEK, and PI (Kapton HN). UTS stands for ultimate tensile strength, in the chart.

| | | PEN | PEEK | PI |
|---|---|---|---|---|
| 25 degrees C. | UTS (psi) | 39,000 | 16,000 | 33,500 |
| | Modulus (psi) | 880,000 | 520,000 | 370,000 |
| | Yield (psi) | 17,500 | | 10,000 |
| 200 degrees C. | UTS (psi) | 13,000 | 8,000 | 20,000 |
| | Modulus (psi) | | | 290,000 |
| | Yield (psi) | <1,000 | | 6,000 |
| Tg | | ~121 degrees C. | ~143 degrees C. | ~380 degrees C. |

It will be appreciated that the modification of the shade base material from its current material (PEN) to an alternate polymer (e.g., PEEK or PI/Kapton) that has increased elevated temperature mechanical properties may be advantageous in certain example embodiments in the sense that it may enable the shade to better withstand internal IG temperatures, especially if the shade is installed in higher temperature climates. It will be appreciated that the use of an alternative polymer may be used in connection with the shutter and/or the on-glass layer in certain example embodiments.

In addition, or as an alternative, certain example embodiments may use a dyed polymer material. For example, a dyed PEN, PEEK, PI/Kapton, or other polymer may be used to created shades with an assortment of colors and/or aesthetics. For instance, dyed polymers may be advantageous for embodiments in transparent/translucent applications, e.g., where the shade conductive layer is a transparent conductive coating or the like.

Although PI/Kapton is a known polymer that has been used in a variety of applications, it sometimes is seen as unacceptable in applications where optics and aesthetics are important. This includes many window applications. One reason for the limited adoption of PI/Kapton relates to the conventional thought that it has a generally yellow-orange coloration. This coloration typically seen as aesthetically unpleasing. Given the plethora of alternative polymers available, PI/Kapton can be easily avoided. Nevertheless, it would be desirable to use PI/Kapton (and/or PEN) for the shade in certain example embodiments, as it can withstand high temperatures and possesses good mechanical properties, even at high temperatures, e.g., as outlined above. PI/Kapton (and/or PEN) also have good shrinkage characteristics (e.g., controllable and high shrinkage rates, ability to form strong coils, etc.), thereby providing for a good spring for the shutter. Given typical optical limitations and the biases of those skilled in the art, however, it would be counterintuitive to use PI/Kapton for the shutter. The inventors have, however, recognized that in example embodiments where the shutter is opaque or substantially opaque, the coloration of the PI/Kapton becomes rather unimportant. That is, when PI/Kapton is used in connection with an opaque or only partially transparent shutter, its yellow-orange coloration is not easily perceivable with the naked eye. The advantageous properties of PI/Kapton relating to high-temperature survivability, spring action, etc., therefore can be realized, even in a window-type application where it otherwise would not be intuitive to use this material. In certain example embodiments, PI/Kapton may be applied as a liquid (e.g., over ITO or another conductive coating) and cured, thereby allowing for rapid, low-cost and high-volume manufacturing over potentially large areas, suitable for windows. In general, PI/Kapton has a better high temperature modulus and high temperature yield strength, better elevated temperature stress relaxation resistance, higher glass transition temperature, etc., compared to alternative shutter materials. PI/Kapton also may now come in different colors (e.g., related to dying) such as, for example, black.

In this regard, it will be appreciated that a transparent or translucent shades may be desirable for some applications. Shades of these types can be created using the base polymer (e.g., PEN) together with a conductive layer of a transparent conductive coating such as ITO or a low-E type coating that creates a color shift. To provide a translucent or transparent shade with a variety of colors, certain example embodiments may use a dyed base polymer (e.g., PEN, PEEK, PI/Kapton), and/or other material. The dying may be accomplished by impregnating dyestuffs, UV absorbers, and/or the like throughout the matrix of the film substrate. This can create films with properties such as, for example, light transmission from 1%-85% of VLTS (5% visible light transmission) and may be lower at some wavelengths; Optical density from 0.10 to 1.3; UV protection up to 97% absorption; any color(s); etc.

Based on the description above, it will be appreciated that the conductor on shutter serves several purposes including, for example, receiving voltage to make the shade go up and down. In certain example embodiments, the conductor on the shutter may be highly reflective in the IR and/or UV spectra. The transparent conductor also increases the coil spring force of the shade, e.g., as a result of its mechanical properties (include modulus of elasticity and yield strength). The coil force also is increased via the transparent conductor as a result of the thermal expansion mismatch between the conductor material and the polymer substrate during the heat treating process used to manufacturer a coil. The polymer substrate (e.g., PI, PEN, or the like) when heated above its glass transition temperature (Tg) irreversibly shrinks. When both materials are heated above the Tg and then cooled back to room temperature, the irreversible shrinkage pf the polymer causes a residual stress mismatch between the polymer substrate and conductive layer that creates a coiled spring. In general, the CTE difference is good for coil force but bad for cracking/crazing/delamination/etc. This is one reason why a metal conductive layer or a conductive coating comprising a metal conductive layer as described herein may perform better than the ITO layer. That is, the ITO is intrinsically brittle and cracks extensively upon high stresses, resulting in the loss of the capability to sustain the stress needed for spring force development.

It therefore will be appreciated that the strength of the coiled spring depends on the material that is being used as the conductive layer, as well as the thickness of the conductive layer. As indicated above, the conductive layer found on the polymer may comprise Al, a combination of Al and Cr, ITO, and/or the like. Al-inclusive conductive layers may be beneficial in opaque applications, whereas ITO-inclusive conductive layers may be better suited for transparent/translucent applications. With an example Al thickness of about ~375 nm and given the low modulus of elasticity of Al, a coil with this composition may be limited in the extent to which it can function (e.g., the height of the IG unit or length of the shade may be limited).

Figure 14:
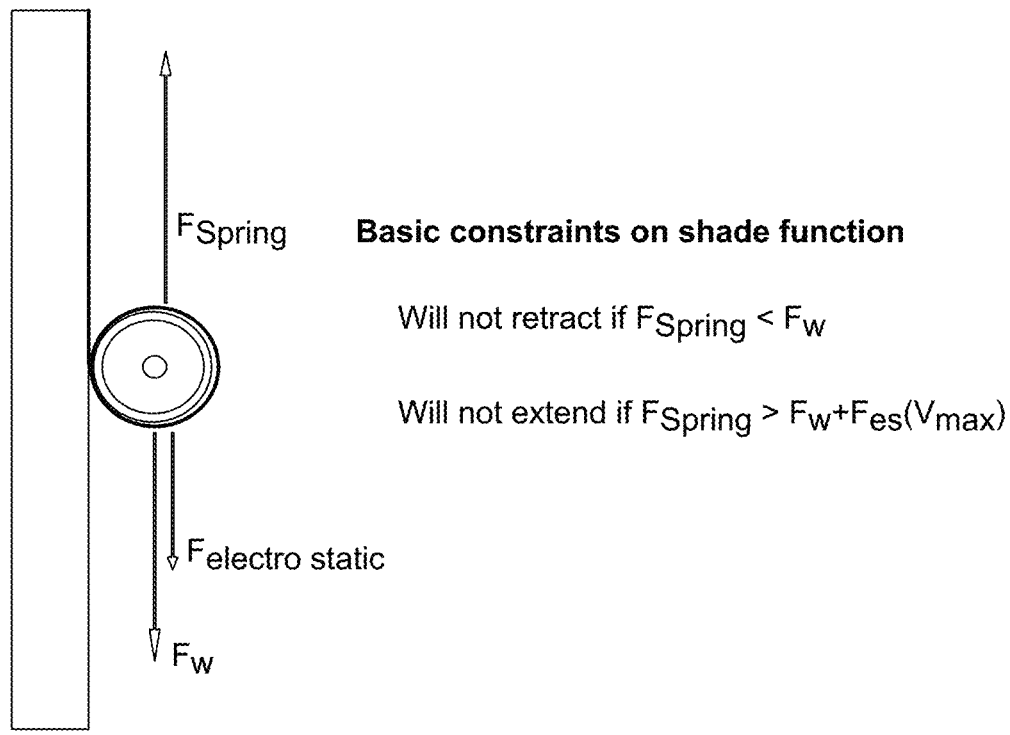
FIG. 14 summarizes the basic constraints on the shade function that may come into play in certain example embodiments.

All else being equal, a longer coil will have more mass and, if the spring force is not greater the weight of the coil in the extended condition, the shade will not retract (roll up). There exists a spring force range that a coil must have in order to be a working shade. For instance, if the spring force of the coil is less than the weight of the coil, then the coil will not retract (and the shade will always be in the down position). Similarly, if the coil spring force is greater than the sum of the weight of the coil and the maximum electrostatic force that can be applied (with the electrostatic force being a function of the voltage applied and the dielectric layer's thickness and its dielectric constant), the coil will not extend (go down). FIG. 14 summarizes the basic constraints on the shade function that may come into play in certain example embodiments.

Certain example embodiments relate to alternate conductive materials that beneficially modify the spring force of the coiled shade to make it usable for various lengths. In this regard, the inventors have recognized that properties of the conductive layer that increase the strength of the coil include an increase in the elastic modulus, an increase in the difference in coefficient of thermal expansion (CTE) between the polymer substrate and the conductive layer, and an increase in the elastic modulus to density ratio. Some of the pure metals that can be used to increase coil strength compared to Al or Cr include Ni, W, Mo, Ti, and Ta. The elastic modulus of studied metal layers ranged from 70 GPa for Al to 330 GPa for Mo. The CTE of studied metal layers ranged from $23.5 \times 10^{-6}$/k for Al down to $4.8 \times 10^{-6}$/k for Mo. In general, the higher the elastic modulus, the higher the CTE mismatch between the PEN or other polymer and the metal, the lower the density, etc., the better the material selection in terms of coil formation. It has been found that incorporating Mo and Ti based conductive layers into shades has resulted in a spring force of the coil that is significantly higher than that which is achievable with Al. The FIG. 15 table includes coil strength related properties for several materials, which may be relevant in certain example embodiments. Certain example embodiments advantageously include a polymer substrate based on PEN, PEEK, PI, or the like, supporting (in order moving away from the substrate) a layer comprising Al followed by a layer comprising Mo. Certain example embodiments advantageously include thin film layer(s) in a conductive coating and/or a conductive coating itself with a greater modulus and lower CTE than Al.

Some of the materials identified herein may not be as corrosion resistant as is desirable. Thus, certain example embodiments may incorporate a thin overcoat layer comprising Al, Ti, stainless steel, or the like, e.g., to increase corrosion resistance. The formation of a protective oxide (e.g., aluminum oxide, titanium oxide, or chromium oxide for SS) in general will help with corrosion resistance. The oxide in general will form to be about 2-7 nm thick. At least 5 nm of the base metal is needed to provide some protection, and certain example embodiments may include about 50 nm or more of the base material, as the additional thickness can help increase the coil strength. It also is noted that although spring strength and tightness of the coil may be improved compared to an Al-based conductive layer, the stress mismatch between the polymer layer and these alternative conductive materials may be problematic. For instance, crazing, cracking, delamination, and/or other problems have been observed with respect to the Mo and Ti in conductive layers based on these materials. These problems are believed to be related to residual stress left in the conductive layers. Introducing a thin layer comprising Al between the polymer substrate and the conductive layer may, however, alleviate some of these problems, e.g., by facilitating the creation of a stress regime that is less brittle and/or less likely to wrinkle, delaminate, etc. For instance, in certain example embodiments, the thin layer comprising Al may be used to shift the stress regime of the layer stack supported by the polymer substrate from a net tensile stress regime to a net compressive stress regime. It is noted that there is a balance, however, in terms of moving from a regime that could promote cracking to a regime that if taken too far can produce wrinkling. Thus, it will be appreciated that certain example embodiments can improve spring performance through the use of alternate materials, with or without stress-ameliorating underlayers. The thickness of the stress-reducing layer may vary based on how much stress is to be alleviated, and other materials may be used in different example embodiments. Furthermore, because a thin layer comprising Al is used for the stress-reducing underlayer and/or the corrosion-reducing overcoat, the reflectivity may not be as high as it otherwise would be and/or the coloration may not be shifted too far in a disadvantageous range, even for transparent type applications. In certain example embodiments, the thickness of the underlayer and/or the corrosion-reducing overcoat, individually or collectively, may be less than 375 nm. It will be appreciated that thin film layer(s) in the second conductive coating may be selected and formed to cause the shutter to move between the opened and closed positions with a spring force greater than that of a shutter having a second conductive coating including only a layer comprising Al.

Thus, in certain example embodiments, a PEN, PI, or other polymer substrate used as a shutter may support a thin layer comprising Al for stress-engineering purposes, with a conductive layer comprising Mo, Ti, or the like directly or indirectly thereon. The conductive layer may support a corrosion-resistant layer comprising Al, Ti, stainless steel, or the like. The side of the substrate opposite these layers optionally may support a decorative ink or the like.

Building-integrated photovoltaic (BIPV) technology continues to gain traction in a variety of home and commercial settings. Certain example embodiments may incorporate solar cells into the IG unit design and, thus, relate to BIPV technology. For instance, certain example embodiments incorporate solar cells into the shutter. In this way, solar energy is not "wasted." A variety of different solar technologies are available. However, certain example embodiments take advantage of copper indium gallium selenide (CIGS) type solar cells, as they typically are the most flexible type of solar cells available. A CIGS solar cell is a thin-film solar cell used to convert sunlight into electric power. A CIGS solar cell may be manufactured by depositing a thin layer of copper, indium, gallium, and selenide on glass or plastic backing, along with electrodes on the front and back to collect current. Because the material has a high absorption coefficient and strongly absorbs sunlight, a much thinner film is required than of other semiconductor materials. This in turn imparts the potential for high flexibility noted above. Certain example embodiments use the conductive (e.g., metallic) layer on the coil as the base conductive layer of the CIGS module. A thin n-type buffer layer is added on top of the absorber. The buffer layer on the conductive layer is typically cadmium sulfide (CdS) deposited via chemical bath deposition or the like. The buffer is overlaid with a thin, intrinsic zinc oxide layer (i-ZnO), which is capped by a thicker, aluminum-doped zinc oxide layer (ZnO:Al or AZO). The i-ZnO layer is used to protect the CdS and the absorber layer from sputtering damage while depositing the ZnO:Al layer, as the latter is usually deposited by DC sputtering, which is known to be a process likely to damage sensitive materials. The salinization process is known to use high temperatures, as well. Thus, using PI, PEN, and the like, are good options for the shutter, e.g., as they are able to handle the higher temperatures, as discussed above. The AZO layer serves as a transparent conducting oxide to collect and move electrons out of the cell while absorbing as little light as possible. Further details regarding CIGS technology, including techniques for creating CIGS solar cells, materials and material thicknesses that may be used, etc., may be found in U.S. Pat. Nos. 9,691,917; 9,419,151; 9,312,417; 9,246,025; 8,809,674; and 8,415,194, the entire contents of each of which is incorporated by reference here.

As will be appreciated from the description above, voltage is applied to the conductive layer to move the shade up and down. When a voltage is not applied to the conductive layer and is the case when the shutter is in the extended position, the shade could act as a CIGS photovoltaic module. The power generated from the CIGS shade could be used to power rechargeable batteries that are used in the function of the shade or be contacted to the home/office. This may be particularly advantageous in retrofit applications, e.g., where it may be difficult or impossible to connect the shade to an external power supply. Regardless of whether the IG unit is used in a retrofit or new install application, the unit of certain example embodiments may be self-sufficient in terms of power by virtue of the inclusion of the CIGS solar cell.

FIG. 16 is a schematic view of a shutter incorporating a CIGS solar cell that may be used in connection with certain example embodiments. As shown in FIG. 16, the shade polymer substrate 406 supports a conductive layer 404 on one major surface, and an optional decorative ink on the opposite major surface. Other layers involved in functionality of CIGS solar cell are formed on the conductive layer 404 and include, for example, the CIGS absorber layer 404, another conductive layer 1604 (e.g., of or including ZnO). An optional antireflection coating 1606 is formed on the upper conductive layer 1604. This antireflection coating 1606 may help increase the amount of visible light reaching the CIGS absorber layer 404 in certain example embodiments. The AR coating 1606 may be a single, broadband AR layer in certain example embodiments. In other example embodiments, the AR coating 1606 may include multiple layers that act on the optical interference principle noted above and, thus, may include alternating high and low index of refraction dielectric material layers. The AR coating 1606 also may aid in coloration of the shutter, as above. Front contact 1608 also is provided. The conductive layer 404 in certain example embodiments may be a multilayer coating. In such cases, the conductive coating may include a layer or layers comprising Mo, Al, Cr, Ni, Y, and/or the like. For instance, in certain example embodiments, a thin layer comprising Al may support a layer comprising Mo. This arrangement may be advantageous in that the inclusion of the Mo-inclusive layer may serve as an efficient back contact for the CIGS absorber layer 1602, while also improving the operation of the spring associated with the shutter, while the inclusion of the Al-inclusive layer may aid in maintaining the conductivity of the Mo back contact while also advantageously impacting the stress regime in the overlying CIGS-related layers (including the layer comprising Mo). Thus, the already flexible CIGS materials may be manufactured to be yet more appropriate for shutter-related applications, in certain example embodiments. The following are example thicknesses that may be used in connection with certain example embodiments: a layer comprising Mo that is 0.5-5 µm thick, a CIGS-inclusive layer that is 1-7 µm thick, a CdS-inclusive layer that is 0.01-0.1 µm thick, a layer comprising ZnO that is 0.1-1 µm thick, and an AR coating that is 0.05-0.15 µm thick.

Figure 18:
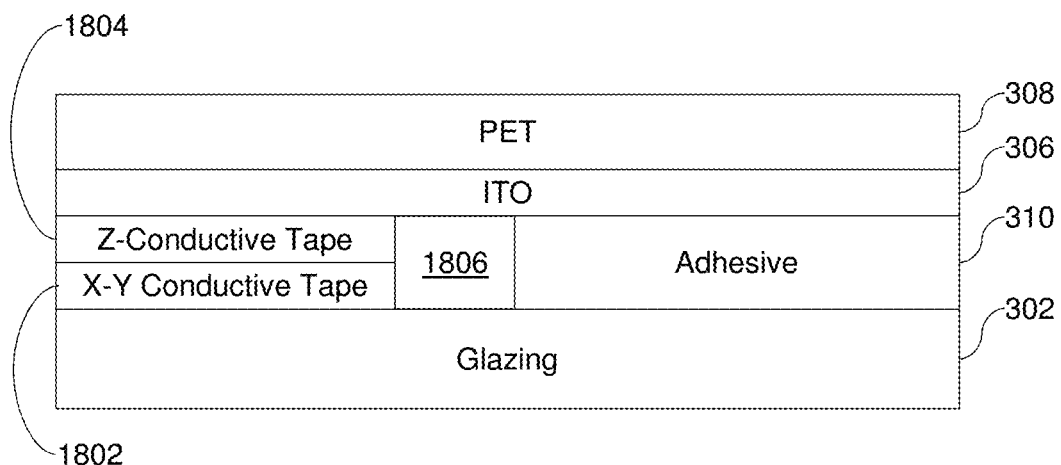
Figure 19:
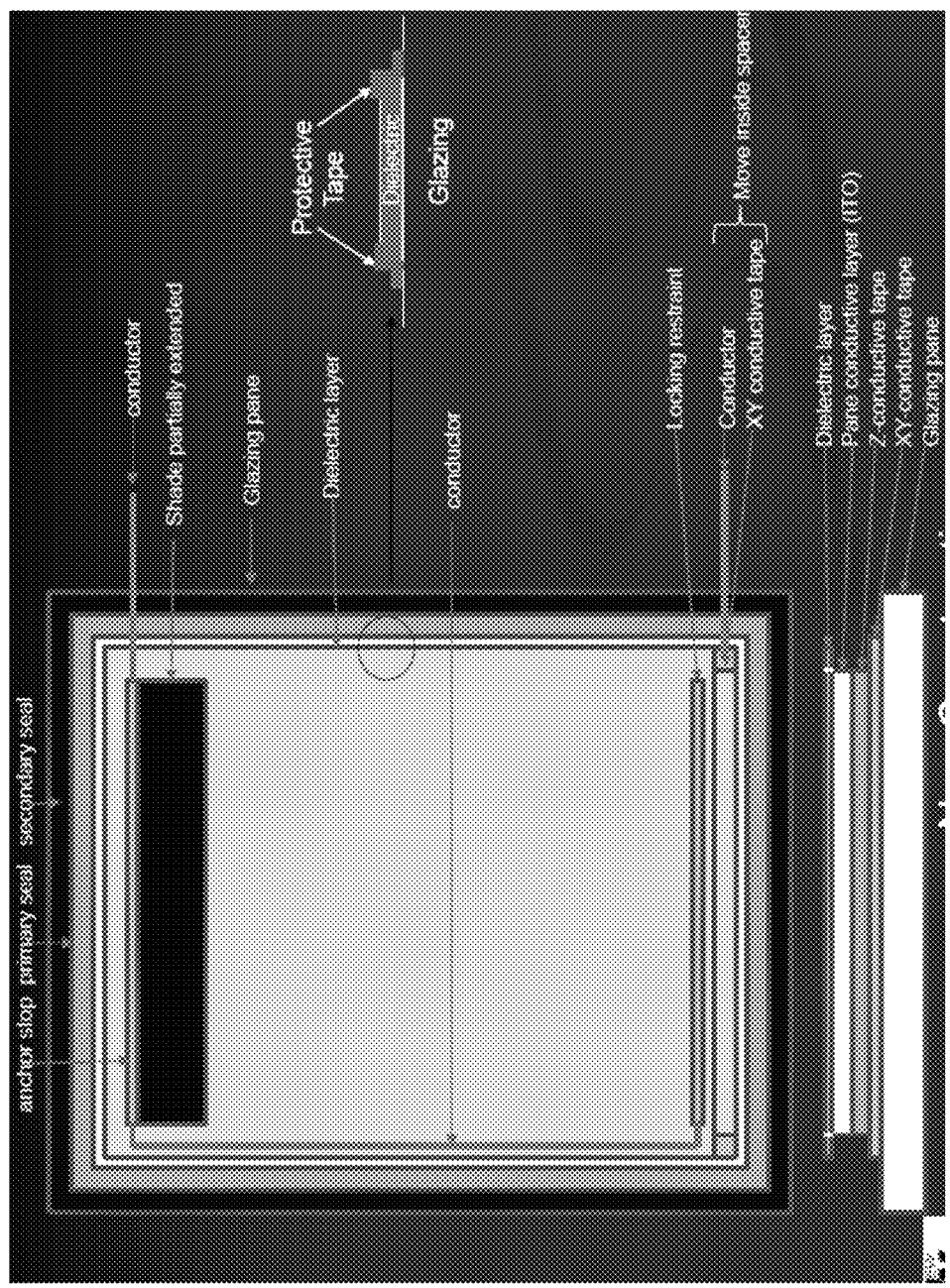

A CIGS solar cell or other self-powering mechanism need not be provided in all embodiments. Thus, alternative techniques for electrically connecting the shade to an external power source and/or controller may be provided. In this regard, FIGS. 17-19 show how the shade may be connected to a glazing and powered, in accordance with certain example embodiments. As shown in these drawings, the on-glass components of the shade 1702 are attached to a hollow anchor stop 1704 or bus bar and the substrate 1706 via a silver paste 1708 and epoxy 1710 or the like. Wires are soldered to the anchor stop 1704 and then run around the perimeter to the bottom of the IG unit, where the bottom anchor stop (locking restraint) is located.

An electrical connection is created between the ITO or other conductive coating 306 on the substrate 302 and conductive tapes 1802 and 1804 (such as, for example, copper tape) via a conductive epoxy, Anisotropic Conductive Film (ACF), or the like 1806. Wires are soldered to the conductive tape 1802 and 1804 and run along the perimeter of the IG unit to a bottom corner where two wires (ITO substrate wire and anchor stop wire) protrude through the IG spacer to the outside of the IG unit, e.g., for electrical connection to an external power source or the like. In certain example embodiments, in general, there is a connection from the ITO to the conductive epoxy to the copper tape or Ag frit on the glass.

Figure 20:
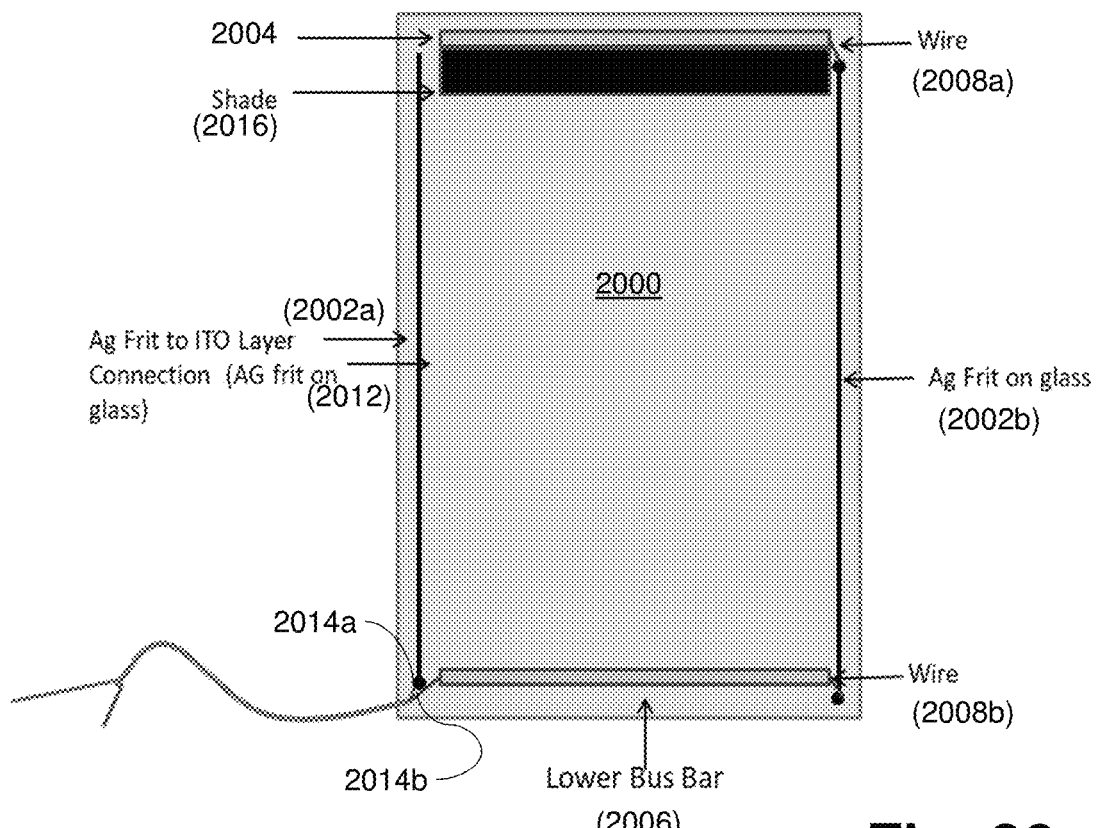
FIG. 20 is a schematic diagram showing an alternative approach for how the shade may be connected to the glazing and powered, in accordance with certain example embodiments.

FIG. 20 is a schematic diagram showing an alternative approach for how the shade may be connected to the glazing and powered, in accordance with certain example embodiments. This example alternate design includes printing or otherwise applying silver frit 2002a-2002b on the glass substrate 2000, e.g., around its peripheral edges. The on-glass components 304 (e.g., including the PET or other polymer film 308 and the TCC 306 comprising ITO or the like) are laminated on top of the Ag frit 2002a-2002b. A first portion of the Ag frit 2002a on the glass 2002 is bonded or otherwise electrically connected to the TCC 306 comprising ITO or the like via a conductive epoxy, ACF, or the like, thereby forming an Ag frit to ITO layer connection 2012.

The shade (shown in FIG. 20 in partially extended 2016 configuration for the sake of explanation), upper bus bar 2004, and lower bus bar 2006 are secured on top of the on-glass components 304 with epoxy or the like. Wires 2008a and 2008b are soldered from the upper and lower bus bars 2004 and 2006 to a second portion of the Ag frit 2002b as shown in FIG. 20, and from the lower bus bar 2006 and the first portion of the Ag Frit 2002a. The wires 2014a and 2014b from the first portion of the Ag Frit 2002a and the lower bus bar 2006 protrude through the IG spacer to the outside of the IG. These protruding wires may be connected to a power source and/or controller. One or more seals may be provided to help restrict outgassing from the cavity of the IG unit, ingress of moisture into the cavity of the IG unit, etc.

Figure 21:
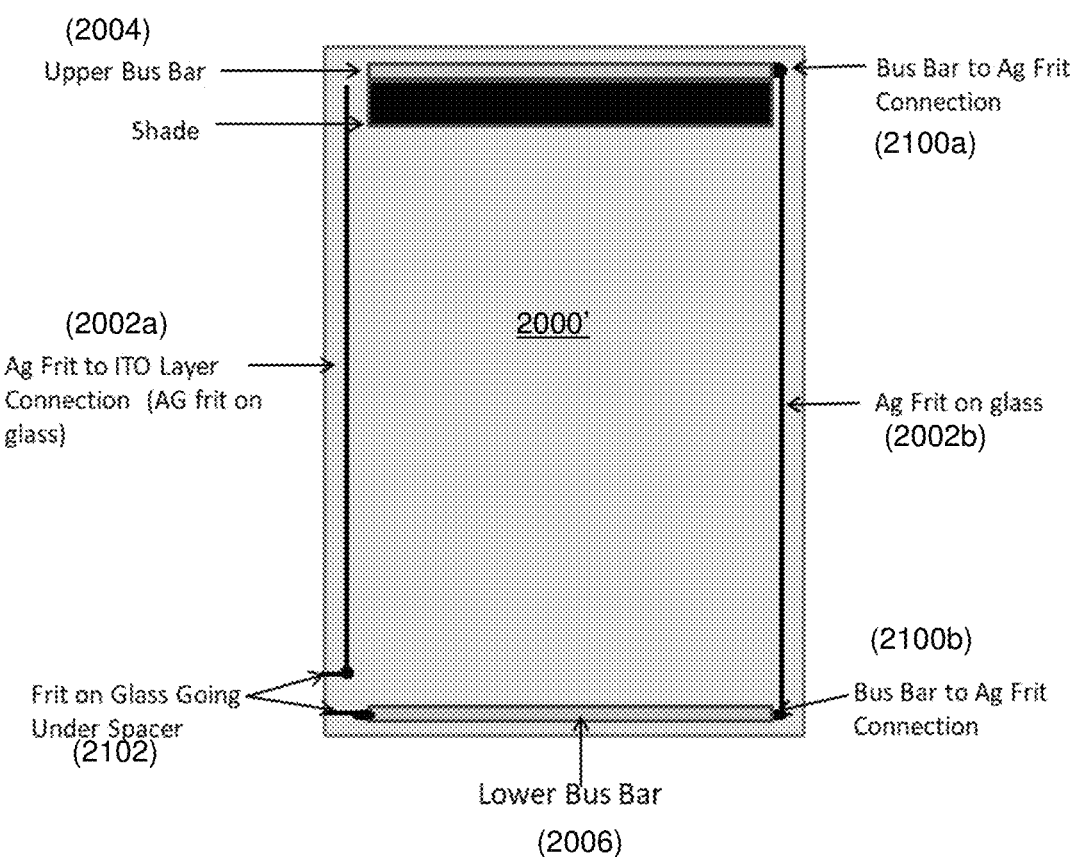
FIG. 21 is a schematic diagram showing another alternative approach for how the shade may be connected to the glazing and powered, in accordance with certain example embodiments.

FIG. 21 is a schematic diagram showing an alternative approach for how the shade may be connected to the glazing and powered, in accordance with certain example embodiments. This example alternate design includes the use of Ag frit, but lacks wires, at least internal to the spacer. As with the FIG. 20 example, the on-glass components 304 are laminated on top of the Ag frit 2002a-2002b. Also as above, a first portion of the frit 2002a is bonded or otherwise electrically connected to the TCC 306 comprising ITO or the like via a conductive epoxy, ACF, or the like. The shade, upper bus bar 2004, and lower bus bar 2006 are secured on top of the glass 2000' with epoxy or the like and to the Ag frit via brazing, soldering, and/or the like. This configuration thus is similar is similar to the FIG. 20 example. However, brazing, soldering, conductive epoxy, ACF, and/or the like are used to form bus bar to Ag frit connections 2100a-2100b shown in FIG. 21. These bus bar to Ag frit connections 2100a-2100b are provided with respect to the second portion of Ag frit 2002b and take the place of the wires 2008a-2008b. Electrical connections to the edge of the glass occur via Ag frit 2102 that goes under the spacer. This Ag frit 2102 extends from the lower bus bar 2006 and an end of the first portion of Ag frit 2002a that is closer to the lower bus bar 2006, thereby taking the place of the wires 2014a-2014b in the FIG. 20 embodiment, and potentially obviating the need for a hole or holes through the spacer. Again, brazing, soldering, conductive epoxy, ACF, and/or the like, may be used to form these electrical connections. Electrical wire connectors can be soldered to the Ag frit on the outside of the IG, or at least external to the spacer.

It will be appreciated that having the Ag on the glass 2000' and running under the spacer (rather than forming a hole in the spacer) may be advantageous in certain example embodiments. For example, the lack of a hole may reduce the likelihood, or slow the progress, of gas leaks, moisture ingress into the IG unit's cavity, etc. These problems might otherwise reduce the lifetime of the IG unit, e.g., by reducing the likelihood of internal moisture from occurring. The presence of internal moisture can create unwanted haze and at even 5-8% relative humidity can cause unwanted charging and premature shade failure.

Although Ag frit is mentioned, it will be appreciated that other types of frit may be used in different example embodiments. It also will be appreciated that having a low-E coating, ITO, or other conductive material directly on the glass (e.g., without a laminating layer) may be used to serve the same or similar purpose as the Ag frit.

It thus will be appreciated from FIGS. 20-21 that first and second electrically conductive bus bars may be located at first and second opposing edges of the first substrate, with each of the bus bars having first and second ends, and with the first and second bus bars being provided, directly or indirectly, on the dielectric or insulator film. First and second patterns of conductive frit may be applied, directly or indirectly, to the first substrate, the frit being interposed between the first substrate and the first conductive coating, with the first pattern of frit electrically connecting with the first conductive coating, with the first and second pattern extending along third and fourth opposing edges of the first substrate, with the first through fourth edges being different from one another, and with the first pattern extending in a direction from the first end of the first bus bar towards the first end of the second bus bar, the second pattern extending in a direction from the second end of the first bus bar towards the second end of the second bus bar. A conductive epoxy, anisotropic conductive film (ACF), or the like may electrically connect the first pattern of frit with the first conductive coating.

In certain example embodiments, a first set of wires may electrically connect the first and second bus bars to the second pattern of frit proximate to the second ends thereof; and a second set of wires may electrically connect to the first end of the second bus bar and an end of the first pattern of frit proximate to the first end of the second bus bar. In such cases, the second set of wires may protrude through a hole in the spacer system for electrical connection to the power source.

In certain example embodiments, third and fourth patterns of conductive frit may electrically connect the first and second bus bars to the second pattern of frit proximate to the second ends of the first and second bus bars; and fifth and sixth patterns of conductive frit may electrically connect to the first end of the second bus bar and an end of the first pattern of frit proximate to the first end of the second bus bar. In such cases, the fifth and sixth patterns of frit may extend towards outer edges of the first substrate under the spacer system for electrical connection to the power source, e.g., such that the fifth and sixth patterns of frit are provided between the spacer system and the first substrate. In certain example embodiments, electrical connections between the power source and the first and second conductive coatings may lack wires internal to the spacer system.

The IG units described herein may incorporate low-E coatings on any one or more of surfaces 1, 2, 3, and 4. As noted above, for example, such low-E coatings may serve as the conductive layers for shades. In other example embodiments, in addition to or apart from serving and conductive layers for shades, a low-E coating may be provided on another interior surface. For instance, a low-E coating may be provided on surface 2, and a shade may be provided with respect to surface 3. In another example, the location of the shade and the low-E coating may be reversed. In either case, a separate low-E coating may or may not be used to help operate the shade provided with respect to surface three. In certain example embodiments, the low-E coatings provided on surfaces 2 and 3 may be silver-based low-E coatings. Example low-E coatings are set forth in U.S. Pat. Nos. 9,802,860; 8,557,391; 7,998,320; 7,771,830; 7,198,851; 7,189,458; 7,056,588; and 6,887,575; the entire contents of each of which is hereby incorporated by reference. Low-E coatings based on ITO and/or the like may be used for interior surfaces and/or exterior surfaces. See, for example, U.S. Pat. Nos. 9,695,085 and 9,670,092; the entire contents of each of which is hereby incorporated by reference. These low-E coatings may be used in connection with certain example embodiments.

Antireflective coatings may be provided on major surfaces of the IG unit, as well. In certain example embodiments, an AR coating may be provided on each major surface on which a low-E coating and shade is not provided. Example AR coatings are described in, for example, U.S. Pat. Nos. 9,796,619 and 8,668,990 as well as U.S. Publication No. 2014/0272314; the entire contents of each of which is hereby incorporated by reference. See also 9,556,066, the entire contents of which is hereby incorporated by reference herein. These AR coatings may be used in connection with certain example embodiments.

The example embodiments described herein may be incorporated into a wide variety of applications including, for example, interior and exterior windows for commercial and/or residential application, skylights, doors, merchandizers such as refrigerators/freezers (e.g., for the doors and/or "walls" thereof), vehicle applications, etc.

Although certain example embodiments have been described in connection with IG units including two substrates, it will be appreciated that the techniques described herein may be applied with respect to so-called triple-IG units. In such units, first, second, and third substantially parallel spaced apart substrates are separated by first and second spacer systems, and shades may be provided adjacent to any one or more of the interior surfaces of the innermost and outermost substrates, and/or to one or both of the surfaces of the middle substrate.

Although certain example embodiments have been described as incorporating glass substrates (e.g., for use of the inner and outer panes of the IG units described herein), it will be appreciated that other example embodiments may incorporate a non-glass substrate for one or both of such panes. Plastics, composite materials, and/or the like may be used, for example. When glass substrates are used, such substrates may be heat treated (e.g., heat strengthened and/or thermally tempered), chemically tempered, left in the annealed state, etc. In certain example embodiments, the inner or outer substrate may be laminated to another substrate of the same or different material.

As used herein, the terms "on," "supported by," and the like should not be interpreted to mean that two elements are directly adjacent to one another unless explicitly stated. In other words, a first layer may be said to be "on" or "supported by" a second layer, even if there are one or more layers therebetween.

In certain example embodiments, an insulating glass (IG) unit is provided. First and second substrates each have interior and exterior major surfaces, and the interior major surface of the first substrate faces the interior major surface of the second substrate. A spacer system helps to maintain the first and second substrates in substantially parallel spaced apart relation to one another and to define a gap therebetween. A dynamically controllable shade interposed between the first and second substrates includes: a first conductive coating provided, directly or indirectly, on the interior major surface of the first substrate; a dielectric or insulator film provided, directly or indirectly, on the first conductive coating; and a shutter including a polymer material supporting a second conductive coating, the polymer material being extendible to serve as a shutter closed position and retractable to serve a shutter open position, wherein the second conductive coating includes a thin film layer comprising Mo and/or Ti. The first and second conductive coatings are electrically connectable to a power source that is controllable to selectively set up an electric potential difference to correspondingly drive the polymer material between the shutter open and closed positions.

In addition to the features of the previous paragraph, in certain example embodiments, the layer(s) in the second conductive coating may be selected and formed to cause the shutter to move between opened and closed positions with a spring force greater than that of a shutter having a second conductive coating including only a layer comprising Al.

In addition to the features of either of the two previous paragraphs, in certain example embodiments, the second conductive coating may further include a corrosion-reducing layer provided over the thin film layer comprising Mo and/or Ti and on a surface thereof opposite the polymer material.

In addition to the features of the previous paragraph, in certain example embodiments, the corrosion-reducing layer may comprise Al, Ti, and/or stainless steel.

In addition to the features of either of the two previous paragraphs, in certain example embodiments, the corrosion-reducing layer may have a thickness of less than 375 nm.

In addition to the features of any of the five previous paragraphs, in certain example embodiments, the second conductive coating may further include an underlayer provided between the thin film layer comprising Mo and/or Ti and the polymer material, e.g., with the underlayer being formed to alter a stress profile of the second conductive coating compared to a situation in which no underlayer is present.

In addition to the features of the previous paragraph, in certain example embodiments, the underlayer may be formed to change the stress profile of the second conductive coating from net tensile to net compressive.

In addition to the features of either of the two previous paragraphs, in certain example embodiments, the underlayer may be a thin film layer comprising Al.

In addition to the features of any of the three previous paragraphs, in certain example embodiments, the underlayer may have a thickness of less than 375 nm.

In addition to the features of any of the four previous paragraphs, in certain example embodiments, the corrosion-reducing layer and the underlayer both may be thin film layers comprising Al and/or have a collective thickness less than 375 nm.

In certain example embodiments, an insulating glass (IG) unit is provided. First and second substrates each have interior and exterior major surfaces, and the interior major surface of the first substrate faces the interior major surface of the second substrate. A spacer system helps to maintain the first and second substrates in substantially parallel spaced apart relation to one another and to define a gap therebetween. A dynamically controllable shade interposed between the first and second substrates includes: a first conductive coating provided, directly or indirectly, on the interior major surface of the first substrate; a dielectric or insulator film provided, directly or indirectly, on the first conductive coating; and a shutter including a polymer material supporting a second conductive coating, the polymer material being extendible to serve as a shutter closed position and retractable to serve a shutter open position, the second conductive coating comprising one or more thin film layers, the thin film layer(s) in the second conductive coating being selected and formed to cause the shutter to move between the opened and closed positions with a spring force greater than that of a shutter having a second conductive coating including only a layer comprising Al. The first and second conductive coatings are electrically connectable to a power source that is controllable to selectively set up an electric potential difference to correspondingly drive the polymer material between the shutter open and closed positions.

In addition to the features of the previous paragraph, in certain example embodiments, the second conductive coating may include a layer comprising metal and a corrosion-reducing layer provided, directly or indirectly, thereon.

In addition to the features of the previous paragraph, in certain example embodiments, the corrosion-reducing layer may comprise Al, Ti, and/or stainless steel.

In addition to the features of any of the three previous paragraphs, in certain example embodiments, the second conductive coating may further include an underlayer provided between the layer comprising metal and the polymer material, e.g., with the underlayer being formed to alter a stress profile of the second conductive coating compared to a situation in which no underlayer is present such that the stress profile of the second conductive coating changes from net tensile to net compressive.

In addition to the features of any of the four previous paragraphs, in certain example embodiments, the second conductive coating may include a layer comprising metal and an underlayer provided between the layer comprising metal and the polymer material, e.g., with the underlayer being formed to alter a stress profile of the second conductive coating compared to a situation in which no underlayer is present such that the stress profile of the second conductive coating changes from net tensile to net compressive In certain example embodiments, a method of making an insulating glass (IG) unit is provided. The method comprises: providing first and second substrates, each having interior and exterior major surfaces; forming a first conductive coating, directly or indirectly, on the interior major surface of the first substrate; providing a dielectric or insulator film, directly or indirectly, on the first conductive coating; locating, adjacent to the dielectric or insulator film, a shutter including a polymer material supporting a second conductive coating, the polymer material in use being extendible to serve as a shutter closed position and retractable to serve as a shutter open position, the thin film layer(s) in the second conductive coating being selected and formed to cause the shutter to move between the opened and closed positions, the thin film layer(s) in the second conductive coating and/or the second conductive coating itself having a greater modulus and lower CTE than Al; electrically connecting the first and second conductive coatings to a power source, wherein the first conductive coating, dielectric or insulator film, and shutter at least partially form a dynamic shade that is controllable in connection with the power source to selectively set up an electric potential difference and correspondingly drive the polymer material between the shutter open and closed positions; and connecting the first and second substrates together in substantially parallel spaced apart relation to one another in connection with a spacer system such that the interior surfaces of the first and second substrates face one another in making the IG unit, a gap being defined therebetween, the dynamic shade being interposed between the first and second substrates in the gap.

In addition to the features of the previous paragraph, in certain example embodiments, the second conductive coating may include a layer comprising metal.

In addition to the features of either of the two previous paragraphs, in certain example embodiments, the second conductive may include a layer comprising Ni, W, Mo, Ti, or Ta.

In addition to the features of any of the three previous paragraphs, in certain example embodiments, the second conductive may include a layer comprising Mo provided over a layer comprising Al.

In addition to the features of any of the four previous paragraphs, in certain example embodiments, the polymer material may comprise PEN and/or PI.

In certain example embodiments, a method of operating a dynamic shade in an insulating glass (IG) unit is provided.

The method comprises having an IG unit made in accordance with the techniques disclosed herein (e.g., in accordance with any one of the 20 previous paragraphs); and selectively activating the power source to move the polymer material between the shutter open and closed positions.

While the invention has been described in connection with what is presently considered to be the most practical and preferred embodiment, it is to be understood that the invention is not to be limited to the disclosed embodiment and/or deposition techniques, but on the contrary, is intended to cover various modifications and equivalent arrangements included within the spirit and scope of the appended claims.

What is claimed is:

1. An insulating glass (IG) unit, comprising:
   first and second substrates, each having interior and exterior major surfaces, the interior major surface of the first substrate facing the interior major surface of the second substrate;
   a spacer system helping to maintain the first and second substrates in substantially parallel spaced apart relation to one another and to define a gap therebetween; and
   a dynamically controllable shade interposed between the first and second substrates, the shade including:
      a first conductive coating provided, directly or indirectly, on the interior major surface of the first substrate;
      a dielectric or insulator film provided, directly or indirectly, on the first conductive coating; and
      a shutter including a polymer material supporting a second conductive coating, the polymer material being extendible to serve as a shutter closed position and retractable to serve a shutter open position, wherein the second conductive coating includes a thin film layer comprising Mo and/or Ti;
   wherein the first and second conductive coatings are electrically connectable to a power source that is controllable to selectively set up an electric potential difference to correspondingly drive the polymer material between the shutter open and closed positions; and
   wherein a corrosion-reducing layer is provided over the thin film layer comprising Mo and/or Ti and on a surface thereof opposite the polymer material.

2. The IG unit of claim 1, wherein the layer(s) in the second conductive coating is/are selected and formed to cause the shutter to move between opened and closed positions with a spring force greater than that of a shutter having a second conductive coating including only a layer comprising Al.

3. The IG unit of claim 1, wherein the corrosion-reducing layer comprises Al, Ti, and/or stainless steel.

4. The IG unit of claim 3, wherein the corrosion-reducing layer comprises Al.

5. The IG unit of claim 3, wherein the corrosion-reducing layer has a thickness of less than 375 nm.

6. The IG unit of claim 1, wherein an underlayer is provided between the thin film layer comprising Mo and/or Ti and the polymer material, the underlayer being formed to alter a stress profile of the second conductive coating compared to a situation in which no underlayer is present.

7. The IG unit of claim 6, wherein the underlayer is formed to change the stress profile of the second conductive coating from net tensile to net compressive.

8. The IG unit of claim 6, wherein the underlayer is a thin film layer comprising Al.

9. The IG unit of claim 6, wherein the underlayer has a thickness of less than 375 nm.

10. The IG unit of claim 6, wherein the corrosion-reducing layer and the underlayer both are thin film layers comprising Al and have a collective thickness less than 375 nm.

11. The IG unit of claim 1, further comprising an underlayer provided between the thin film layer comprising Mo and/or Ti and the polymer material, the underlayer being formed to alter a stress profile of the second conductive coating compared to a situation in which no underlayer is present.

12. The IG unit of claim 11, wherein the underlayer is formed to change the stress profile of the second conductive coating from net tensile to net compressive.

13. An insulating glass (IG) unit, comprising:
   first and second substrates, each having interior and exterior major surfaces, the interior major surface of the first substrate facing the interior major surface of the second substrate;
   a spacer system helping to maintain the first and second substrates in substantially parallel spaced apart relation to one another and to define a gap therebetween; and
   a dynamically controllable shade interposed between the first and second substrates, the shade including:
      a first conductive coating provided, directly or indirectly, on the interior major surface of the first substrate;
      a dielectric or insulator film provided, directly or indirectly, on the first conductive coating; and
      a shutter including a polymer material supporting a second conductive coating, the polymer material being extendible to serve as a shutter closed position and retractable to serve a shutter open position, the second conductive coating comprising one or more thin film layers, the thin film layer(s) in the second conductive coating being selected and formed to cause the shutter to move between the opened and closed positions with a spring force greater than that of a shutter having a second conductive coating including only a layer comprising Al;
   wherein the first and second conductive coatings are electrically connectable to a power source that is controllable to selectively set up an electric potential difference to correspondingly drive the polymer material between the shutter open and closed positions; and
   wherein a corrosion-reducing layer is provided over the thin film layer(s) in the second conductive coating and on a surface thereof opposite the polymer material.

14. The IG unit of claim 13, wherein the second conductive coating includes a layer comprising metal, and wherein the corrosion-reducing layer is provided, directly or indirectly, thereon.

15. The IG unit of claim 13, wherein the corrosion-reducing layer comprises Al, Ti, and/or stainless steel.

16. The IG unit of claim 14, wherein an underlayer is provided between the layer comprising metal and the polymer material, the underlayer being formed to alter a stress profile of the second conductive coating compared to a situation in which no underlayer is present such that the stress profile of the second conductive coating changes from net tensile to net compressive.

17. The IG unit of claim 13, wherein the second conductive coating includes a layer comprising metal, and wherein an underlayer is provided between the layer comprising metal and the polymer material, the underlayer being formed to alter a stress profile of the second conductive coating compared to a situation in which no underlayer is present such that the stress profile of the second conductive coating changes from net tensile to net compressive.

18. A method of making an insulating glass (IG) unit, the method comprising:
- providing first and second substrates, each having interior and exterior major surfaces;
- forming a first conductive coating, directly or indirectly, on the interior major surface of the first substrate;
- providing a dielectric or insulator film, directly or indirectly, on the first conductive coating;
- locating, adjacent to the dielectric or insulator film, a shutter including a polymer material supporting a second conductive coating, the polymer material in use being extendible to serve as a shutter closed position and retractable to serve as a shutter open position, the thin film layer(s) in the second conductive coating being selected and formed to cause the shutter to move between the opened and closed positions, the thin film layer(s) in the second conductive coating and/or the second conductive coating itself having a greater modulus and lower CTE than Al;
- electrically connecting the first and second conductive coatings to a power source, wherein the first conductive coating, dielectric or insulator film, and shutter at least partially form a dynamic shade that is controllable in connection with the power source to selectively set up an electric potential difference and correspondingly drive the polymer material between the shutter open and closed positions; and
- connecting the first and second substrates together in substantially parallel spaced apart relation to one another in connection with a spacer system such that the interior surfaces of the first and second substrates face one another in making the IG unit, a gap being defined therebetween, the dynamic shade being interposed between the first and second substrates in the gap;
- wherein a corrosion-reducing layer is provided over the thin film layer(s) in the second conductive coating and on a surface thereof opposite the polymer material.

19. The method of claim 18, wherein the second conductive coating includes a layer comprising metal.

20. The method of claim 18, wherein the second conductive includes a layer comprising Ni, W, Mo, Ti, or Ta.

21. The method of claim 18, wherein the second conductive includes a layer comprising Mo provided over a layer comprising Al.

22. The method of claim 21, wherein the polymer material comprises PEN.

23. The method of claim 21, wherein the polymer material comprises PI.

24. A method of operating a dynamic shade in an insulating glass (IG) unit, the method comprising:
- having an IG unit made in accordance with the method of claim 18; and
- selectively activating the power source to move the polymer material between the shutter open and closed positions.

* * * * *